(12) United States Patent
Hatano et al.

(10) Patent No.: US 8,120,686 B2
(45) Date of Patent: Feb. 21, 2012

(54) SOLID-STATE IMAGE PICKUP APPARATUS

(75) Inventors: Yuuichirou Hatano, Yamato (JP);
Hideaki Takada, Yokohama (JP);
Hiroki Hiyama, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 518 days.

(21) Appl. No.: 12/402,082

(22) Filed: Mar. 11, 2009

(65) Prior Publication Data
US 2009/0237543 A1 Sep. 24, 2009

(30) Foreign Application Priority Data

Mar. 19, 2008 (JP) ................. 2008-071597

(51) Int. Cl.
*H04N 3/14* (2006.01)
*H04N 9/64* (2006.01)
(52) U.S. Cl. ........................ 348/308; 348/243
(58) Field of Classification Search ............ 348/308, 348/300, 301, 241, 243, 294
See application file for complete search history.

(56) References Cited

U.S. PATENT DOCUMENTS

| | | | |
|---|---|---|---|
| 6,188,094 B1 | 2/2001 | Kochi et al. | 257/232 |
| 7,187,052 B2 | 3/2007 | Okita et al. | 257/444 |
| 7,227,208 B2 | 6/2007 | Ogura et al. | 257/292 |
| 7,283,305 B2 | 10/2007 | Okita et al. | 359/619 |
| 7,538,804 B2 | 5/2009 | Okita et al. | 348/241 |
| 2006/0027843 A1 | 2/2006 | Ogura et al. | 257/291 |
| 2006/0043440 A1 | 3/2006 | Hiyama et al. | 257/291 |
| 2006/0044439 A1 | 3/2006 | Hiyama et al. | 348/308 |
| 2007/0205439 A1 | 9/2007 | Okita et al. | 257/228 |
| 2010/0259648 A1* | 10/2010 | Iijima et al. | 348/241 |

FOREIGN PATENT DOCUMENTS

JP 2006-74009 A 3/2006

* cited by examiner

*Primary Examiner* — Mohammed Hasan

(74) *Attorney, Agent, or Firm* — Fitzpatrick, Cella, Harper & Scinto

(57) ABSTRACT

A solid-state image pickup apparatus includes a first antireflection coating film formed on a light-receiving surface of a first photoelectric conversion element and a second antireflection coating film formed on a light-receiving surface of a second photoelectric conversion element. A total length of first photoelectric conversion element facing portions of gate lines adjacent to the first photoelectric conversion element is shorter than a total length of second photoelectric conversion element facing portions of gate lines adjacent to the second photoelectric conversion element. An area of the first antireflection coating film is larger than that of the second antireflection coating film.

14 Claims, 16 Drawing Sheets

SOLID-STATE IMAGE PICKUP APPARATUS

FIELD OF THE INVENTION

The present invention relates to a solid-state image pickup apparatus used for a digital camera, a digital video camera, a copier, or a facsimile machine, and also relates to a camera using the solid-state image pickup apparatus.

BACKGROUND OF THE INVENTION

Description of the Related Art

An increasing number of pixels are included in solid-state image pickup apparatuses. In amplifying-type solid-state image pickup apparatuses, which include pixels each including an amplifying MOS transistor, in order to increase the number of pixels in a limited chip area, a pixel reading circuit is shared among a plurality of photoelectric conversion elements. Methods of decreasing the number of transistors for a single photoelectric conversion element are therefore used.

A method of reducing the difference in dark current between pixels connected to each other is disclosed in Japanese Patent Laid-Open No. 2006-074009. Using this method, the difference in dark current between two or more pixels connected to each other can be reduced.

However, in adjacent pixels, it is very difficult to make the lengths of gate electrodes of transistors and the potentials of these gate electrodes during an accumulation period conform to each other. A slight change in layout of miniaturized pixels leads to changes in etching accuracy and etching shape. Accordingly, it is more difficult to make the areas of these gate electrodes conform to each other after processing. If the number of transistors for shared use increases, driving-related timing becomes complicated. It is therefore difficult to make the potentials of these gate electrodes conform to each other during the accumulation period. If high-speed reading is required, the number of driving-related timing constraints is increased. Accordingly, in reality, it is impossible to make the potentials of these gate electrodes conform to each other. Difficulties similar to the above-described difficulties that occur in a case where a transistor is shared among a plurality of photoelectric conversion apparatuses may occur in a case where the lengths of gate electrodes of MOS transistors adjacent to photoelectric conversion elements are different from each other.

SUMMARY OF THE INVENTION

The present invention, according to aspects thereof, provides a technique for reducing the difference in dark current between photoelectric conversion elements in a case where the layout of gate electrodes of MOS transistors adjacent to these photoelectric conversion elements is asymmetrical.

There is provided a solid-state image pickup apparatus that includes a plurality of cells each including at least a plurality of photoelectric conversion elements, including a first photoelectric conversion element and a second photoelectric conversion element, an amplifying MOS transistor for amplifying a signal corresponding to an electric charge of each of the plurality of photoelectric conversion elements and outputting the amplified signal, and a reset MOS transistor for supplying a reference voltage to the amplifying MOS transistor so as to set a potential of a gate electrode of the amplifying MOS transistor to a reference potential. The solid-state image pickup apparatus includes: a first antireflection coating film that is formed on a light-receiving surface of the first photoelectric conversion element and is configured to suppress reflection of light at an interface between the first photoelectric conversion element and an interlayer insulation film; and a second antireflection coating film that is formed on a light-receiving surface of the second photoelectric conversion element and is configured to suppress reflection of light at an interface between the second photoelectric conversion element and an interlayer insulation film. A total length of first photoelectric conversion element facing portions of gate lines of the amplifying MOS transistor and the reset MOS transistor, which are disposed on an element isolation region adjacent to the first photoelectric conversion element, is shorter than a total length of second photoelectric conversion element facing portions of gate lines of the amplifying MOS transistor and the reset MOS transistor, which are disposed on an element isolation region adjacent to the second photoelectric conversion element. An area of the first antireflection coating film is larger than that of the second antireflection coating film.

There is provided a solid-state image pickup apparatus that includes a plurality of cells each including at least a plurality of photoelectric conversion elements, including a first photoelectric conversion element and a second photoelectric conversion element, an amplifying MOS transistor for amplifying a signal corresponding to an electric charge of each of the first and second photoelectric conversion elements and outputting the amplified signal, and a reset MOS transistor for supplying a reference voltage to the amplifying MOS transistor so as to set a potential of a gate electrode of the amplifying MOS transistor to a reference potential. The solid-state image pickup apparatus includes: a first channel stop region that is formed under an element isolation region adjacent to the first photoelectric conversion element so that the first channel stop region is adjacent to the first photoelectric conversion element; and a second channel stop region that is formed under an element isolation region adjacent to the second photoelectric conversion element so that the second channel stop region is adjacent to the second photoelectric conversion element. A total length of first photoelectric conversion element facing portions of gate lines of the amplifying MOS transistor and the reset MOS transistor, which are disposed on an element isolation region adjacent to the first photoelectric conversion element, is shorter than a total length of second photoelectric conversion element facing portions of gate lines of the amplifying MOS transistor and the reset MOS transistor, which are disposed on an element isolation region adjacent to the second photoelectric conversion element. A width of the first channel stop region is less than that of the second channel stop region.

There is provided a solid-state image pickup apparatus including a plurality of photoelectric conversion elements, which includes a first photoelectric conversion element and a second photoelectric conversion element, and a plurality of MOS transistors for reading a signal corresponding to an electric charge of a photoelectric conversion element for each of the plurality of photoelectric conversion elements. The solid-state image pickup apparatus includes: a first antireflection coating film that is formed on a light-receiving surface of the first photoelectric conversion element and is configured to suppress reflection of light at an interface between the first photoelectric conversion element and an interlayer insulation film; and a second antireflection coating film that is formed on a light-receiving surface of the second photoelectric conversion element and is configured to suppress reflection of light at an interface between the second photoelectric conversion element and an interlayer insulation film. A total length of first photoelectric conversion element facing portions of gate lines of the plurality of MOS transistors, which are disposed on an element isolation region adjacent to the first photoelectric conversion element, is shorter than a total length of second photoelectric conversion element facing portions of gate lines of the plurality of MOS transistors, which are disposed on an element isolation region adjacent to the second photoelectric conversion element. A voltage for bringing a MOS transistor out of conduction is supplied to a gate electrode of each of the plurality of MOS transistors during an entire accumulation period of each of the plurality of photoelectric conversion elements. An area of the first antireflection coating film is smaller than that of the second antireflection coating film.

There is provided a solid-state image pickup apparatus including a plurality of photoelectric conversion elements, which includes a first photoelectric conversion element and a second photoelectric conversion element, and a plurality of MOS transistors for reading a signal corresponding to an electric charge of a photoelectric conversion element for each of the plurality of photoelectric conversion elements. The solid-state image pickup apparatus includes: a first channel stop region that is formed under an element isolation region adjacent to the first photoelectric conversion element so that the first channel stop region is adjacent to the first photoelectric conversion element; and a second channel stop region that is formed under an element isolation region adjacent to the second photoelectric conversion element so that the second channel stop region is adjacent to the second photoelectric conversion element. A total length of first photoelectric conversion element facing portions of gate lines of the plurality of MOS transistors, which are disposed on an element isolation region adjacent to the first photoelectric conversion element, is shorter than a total length of second photoelectric conversion element facing portions of gate lines of the plurality of MOS transistors, which are disposed on an element isolation region adjacent to the second photoelectric conversion element. A voltage for bringing a MOS transistor out of conduction is supplied to a gate electrode of each of the plurality of MOS transistors during an entire accumulation period of each of the plurality of photoelectric conversion elements. A width of the first channel stop region is greater than that of the second channel stop region.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain principles of the invention.

DESCRIPTION OF THE EMBODIMENTS

First Embodiment

Figure 1:
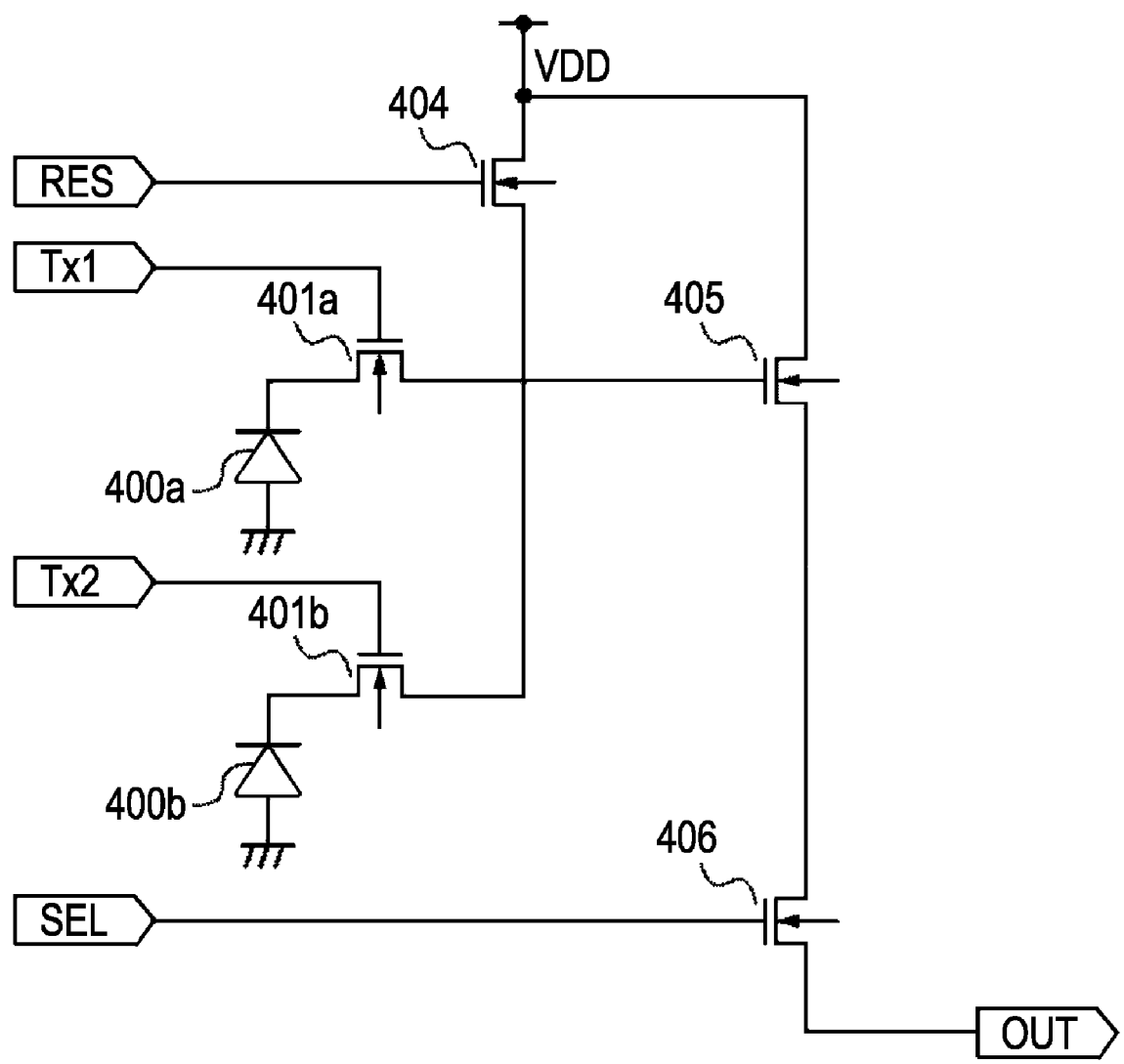
FIG. 1 is a diagram illustrating an exemplary equivalent circuit of a solid-state image pickup apparatus according to a first embodiment of the present invention.

FIG. 1 is a diagram illustrating an equivalent circuit of a solid-state image pickup apparatus according to a first embodiment. The solid-state image pickup apparatus includes a first photoelectric conversion element 400a and a second photoelectric conversion element 400b, which are photodiodes in this embodiment. In this drawing, only two photoelectric conversion elements are illustrated. However, a larger number of photoelectric conversion elements may be included in a solid-state image pickup apparatus according to this embodiment.

Transfer portions 401a and 401b for transferring the electric charge of a photoelectric conversion element are MOS transistors in this embodiment. A reset portion 404, for resetting the input portion of an amplification portion to be described later by setting the potential of a gate electrode of the amplification portion to a reference potential, is a MOS transistor in this embodiment. An amplification portion 405 for amplifying a signal corresponding to a signal electric charge generated from a photoelectric conversion element and outputting the amplified signal is a MOS transistor in this embodiment. The amplification portion 405 forms a source follower circuit along with a constant current source (not illustrated). The gate electrode of the amplification portion 405 (MOS transistor) is electrically connected to a floating diffusion (FD) area on a semiconductor substrate. A signal electric charge is transferred from the first photoelectric conversion element 400a or the second photoelectric conversion element 400b to the FD area via the transfer portion 401a or 401b, and is then converted into a voltage. A signal corresponding to the voltage is read out to a signal line via the amplification portion 405 (MOS transistor).

A selection portion 406 for controlling the operation and non-operation states of the amplification portion 405 (MOS transistor) and performing a pixel selection operation is a MOS transistor in this embodiment. Referring to FIG. 1, a reading circuit portion (the reset portion 404 (MOS transistor), the amplification portion 405 (MOS transistor), and the selection portion 406 (MOS transistor)) is shared between a plurality of (e.g., two) photoelectric conversion elements. A single cell includes these photoelectric conversion elements and the reading circuit portion. A plurality of such cells is disposed in a pixel region. Each such cell includes at least a plurality of photoelectric conversion elements, an amplifying MOS transistor, and a reset MOS transistor.

Figure 2:
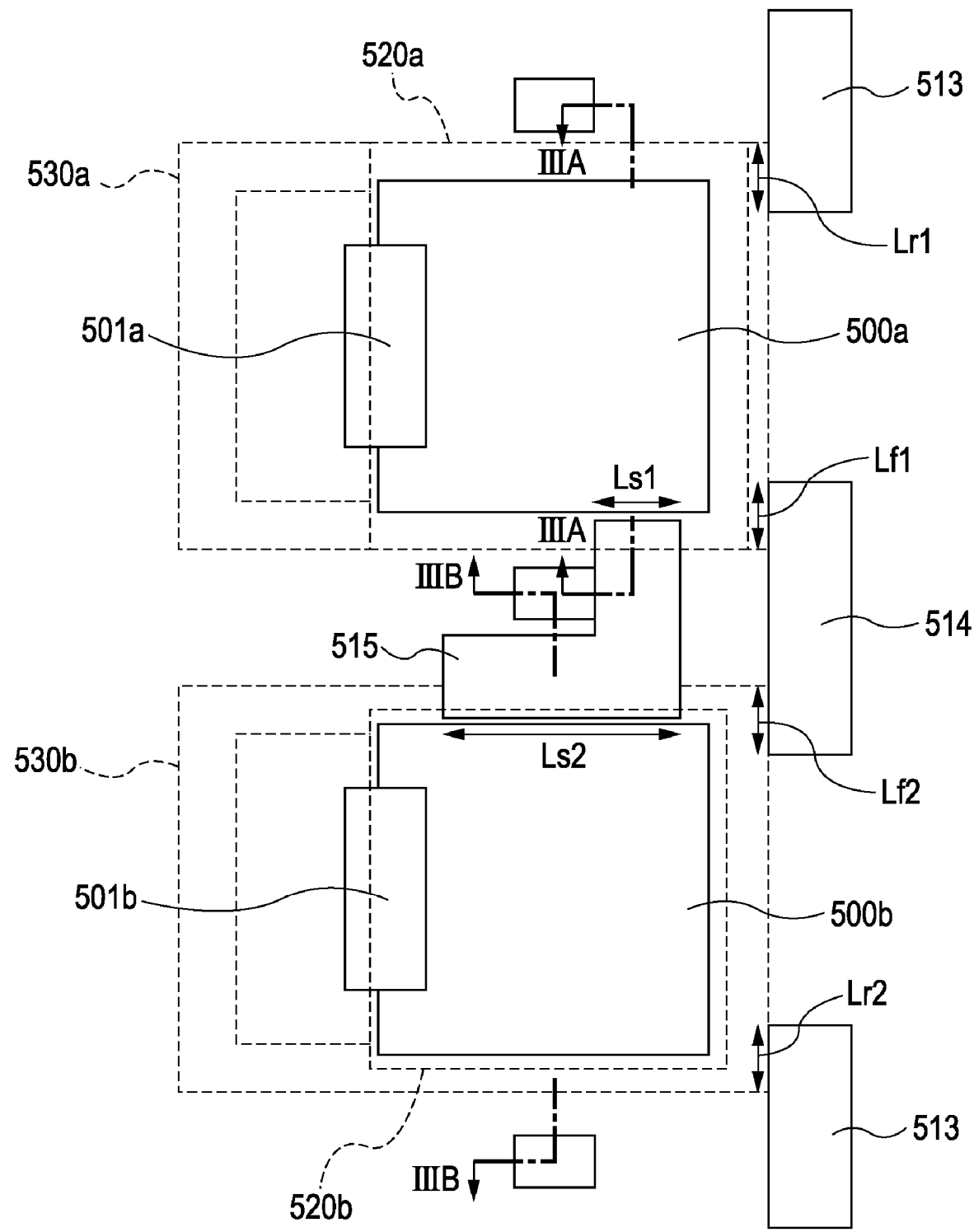
FIG. 2 is a plan view of a solid-state image pickup apparatus according to the first embodiment.

FIG. 2 is a plan view of a solid-state image pickup apparatus having the equivalent circuit illustrated in FIG. 1.

A semiconductor region 500a is a part of the first photoelectric conversion element. A semiconductor region 500b is a part of the second photoelectric conversion element. The semiconductor regions 500a and 500b can accumulate signal electric charges. If a signal electric charge is an electron, the semiconductor regions 500a and 500b are N-type semiconductor regions. If a signal electric charge is a hole, the semiconductor regions 500a and 500b are P-type semiconductor regions. Gate electrodes 501a and 501b are gate electrodes of MOS transistors (transfer MOS transistors) functioning as the transfer portions.

A gate electrode 513 is a gate electrode of a MOS transistor functioning as the reset portion (reset MOS transistor). A gate electrode 514 is a gate electrode of a MOS transistor functioning as the amplification portion (amplifying MOS transistor). A gate electrode 515 is a gate electrode of a MOS transistor functioning as the selection portion (selection MOS transistor). Each of these gate electrodes is disposed on an active region functioning as a channel of a MOS transistor and on an element isolation region used to determine or define the active region. For simplification of explanation, a portion of each of these gate electrodes disposed on the channel and a portion of the gate electrode on the element isolation region are collectively called a gate electrode.

Ls denotes the length of the gate electrode of the selection MOS transistor, Lr denotes the length of the gate electrode of the reset MOS transistor, and Lf denotes the length of the amplifying MOS transistor. More specifically, each of the above-described lengths denotes the length of a portion of a gate line of a MOS transistor that faces a photoelectric conversion element. The MOS transistor is disposed on an element isolation region adjacent to the photoelectric conversion element.

An index 1 or 2 for Ls, Lr, or Lf denotes the first or second photoelectric conversion element. For example, Ls1 represents a length of a portion of the gate electrode 515 that is adjacent to and faces the first photoelectric conversion element. The length of a portion of a gate electrode adjacent to the first photoelectric conversion element is different from that of a portion of the gate electrode adjacent to the second photoelectric conversion element. More specifically, in this embodiment, Ls1+Lr1+Lf1<Ls2+Lr2+Lf2 is satisfied. The transfer MOS transistor is disposed for each of the photoelectric conversion elements. Accordingly, the above-described case in which the length of a portion of a gate electrode adjacent to the first photoelectric conversion element is different from that of a portion of the gate electrode adjacent to the second photoelectric conversion element does not occur. Therefore, transistors other than the transfer MOS transistors have been described.

A first antireflection coating film 520a is disposed on the light-receiving surface of the first photoelectric conversion element. A second antireflection coating film 520b is disposed on the light-receiving surface of the second photoelectric conversion element. Each of the first antireflection coating film 520a and the second antireflection coating film 520b suppresses the reflection of incident light on the interface between a photoelectric conversion element and an interlayer insulation film (not illustrated), and is made of a material such as a silicon nitride film having a refractive index between the refractive index of a material used for the photoelectric conversion element, such as silicon, and the refractive index of a material used for the interlayer insulation film, such as silicon oxide.

A first channel stop region 530a and a second channel stop region 530b are semiconductor regions having a conductivity type opposite to that of a signal electric charge, and prevent the formation of a channel between adjacent active regions disposed under element isolation regions or on the sides of the element isolation regions. The first channel stop region 530a is disposed under an element isolation region adjacent to the first photoelectric conversion element so that the first channel stop region 530a is adjacent to the first photoelectric conversion element. The second channel stop region 530b is disposed under an element isolation region adjacent to the second photoelectric conversion element so that the second channel stop region 530b is adjacent to the second photoelectric conversion element. For example, if a signal electric charge is an electron, a P-type semiconductor region is disposed as a channel stop region.

Figure 3A:
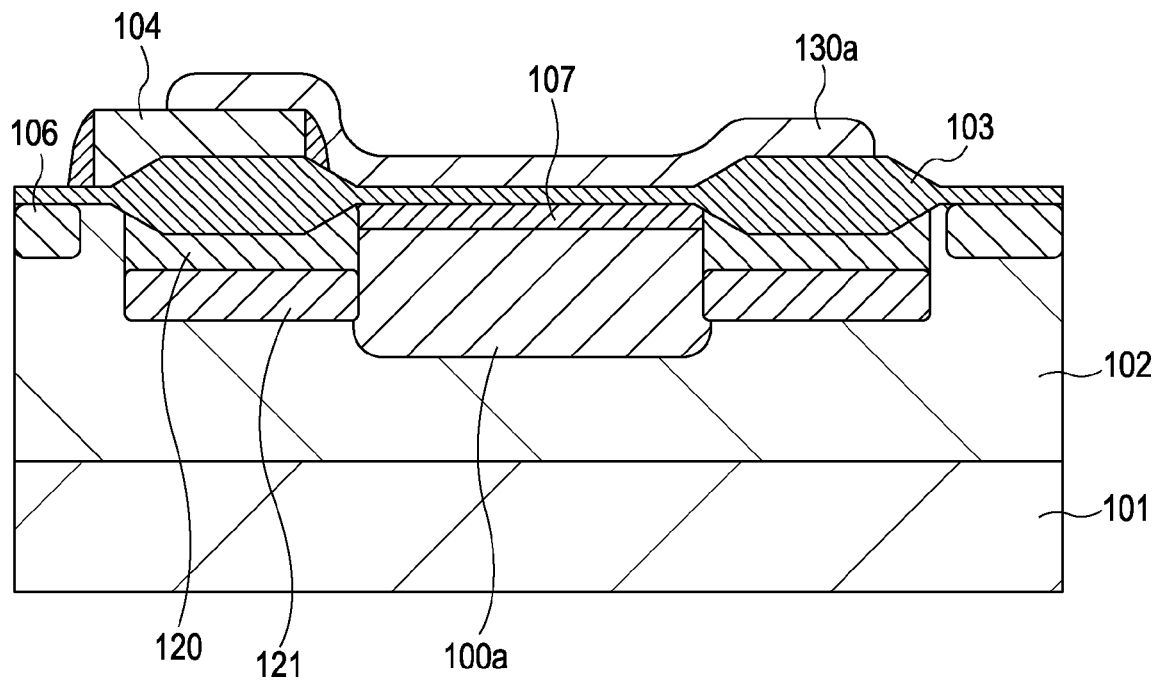
FIGS. 3A and 3B are cross-sectional views of a solid-state image pickup apparatus according to the first embodiment.
Figure 3B:
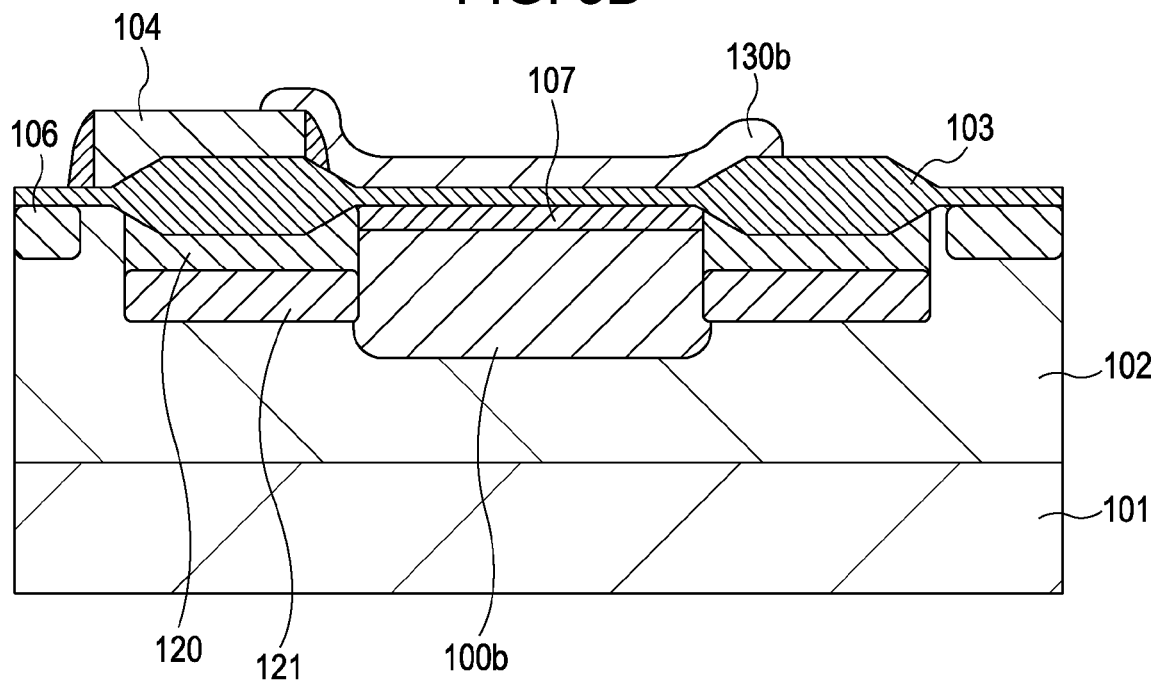

FIG. 3A is a cross-sectional view taken along the line IIIA of FIG. 2. FIG. 3B is a cross-sectional view taken along the line IIIB of FIG. 2. The conductivity type of each semiconductor region in a case that an electron is used as a signal electric charge will be described. If a hole is used as a signal electric charge, the conductivity type of each semiconductor region is opposite to that of a corresponding semiconductor region in the above-described case.

Each of N-type semiconductor regions 100a and 100b is a part of a photoelectric conversion element, and can accumulate signal electric charges. The N-type semiconductor regions 100a and 100b correspond to the semiconductor regions 500a and 500b, respectively.

A part of a P-type well 102 and each of the N-type semiconductor regions 100a and 100b form a P-N junction diode. This P-N junction diode is a photoelectric conversion element.

An element isolation region 103 is formed by LOCOS or STI. An active region in which each element is formed is determined or defined by the element isolation region 103. For example, each of the semiconductor regions 100a and 100b, which is a part of a photoelectric conversion element, is surrounded by the element isolation region 103 except for a channel region used to transfer an electric charge, and is electrically separated from an adjacent active region by the element separation region 103. In an adjacent active region, for example, a source/drain region of each MOS transistor or an adjacent photoelectric conversion element is disposed. On the channel region, a gate electrode of a MOS transistor functioning as a transfer portion is disposed. On the element isolation region 103, a gate line 104 of a selection MOS transistor is disposed.

A source/drain region 106 of a MOS transistor disposed in an adjacent active region is illustrated. A P-type semiconductor region 107 is disposed on each of the semiconductor regions 100a and 100b. Using the P-type semiconductor region 107, it is possible to achieve a pinned or embedded photodiode as a photoelectric conversion element. The pinned photodiode can minimize the effect of a dark current occurring on the surface thereof.

P-type channel stop regions 120 and 121 correspond to each of the channel stop regions 530a and 530b. The channel stop region 120 is disposed on the channel stop region 121. The impurity concentration of the channel stop region 120 is lower than that of the channel stop region 121. The channel stop regions 120 and 121 are disposed under the element isolation region 103, but may be extended to the side surfaces of the element isolation region 103.

Antireflection coating films 130a and 130b correspond to the antireflection coating films 520a and 520b, respectively. After forming the antireflection coating films 130a and 130b, a multilayer interconnection structure (not illustrated) composed of an interlayer insulation film and a metal wiring layer is layered.

On the metal wiring layer included in the multilayer interconnection structure, a silicon nitride film (not illustrated) formed using, for example, a plasma CVD method is disposed. The silicon nitride film functions as a protection film. Using the silicon nitride film, hydrogen sintering processing for suppressing the interface state near the light-receiving surface is performed. More specifically, if heat treatment is performed at a temperature ranging from 400° C. to 475° C. after the silicon nitride film has been formed, hydrogen radicals are dissociated from the silicon nitride film, diffuse through the interlayer insulation film, and reach the interface. Each hydrogen radical suppresses an interface state at the interface between the silicon and the silicon oxide film (the interlayer insulation film). By suppressing the interface states, the number of sources of dark current is reduced. Thus, the amount of dark current can be minimized.

In the case of a solid-state image pickup apparatus for capturing a color image, a color filter and a micro lens may be disposed as a top layer.

As described previously, in this embodiment, the length of a portion of a gate electrode facing the first photoelectric conversion element and that of a portion of the gate electrode facing the second conversion element, which is adjacent to the first photoelectric conversion element via the element isolation region, are different from each other. More specifically, $Ls1+Lr1+Lf1<Ls2+Lr2+Lf2$ is satisfied. As is apparent from FIG. 2, the length of a portion of the gate electrode of the selection MOS transistor facing the second photoelectric conversion element is longer than that of a portion of the gate electrode of the selection MOS transistor facing the first photoelectric conversion element. The selection MOS transistor is brought into conduction in a part of an electric charge accumulation period of a photoelectric conversion element so as to, for example, externally output a pixel reset signal required for CDS processing. In a case that high-sped signal reading is required, the selection MOS transistor is brought into conduction.

If the selection MOS transistor is an N-type MOS transistor, in a conductive state of the selection MOS transistor, a voltage higher than that applied to a gate electrode in a non-conductive state of the selection MOS transistor is applied to the gate electrode. While a high voltage is applied to the gate electrode, electrons gather in the vicinity of the interface between the P-type channel stop region under the element isolation region and the element isolation region, whereby a dark current source is generated. If there is an asymmetrical layout, that is, the length of a portion of the gate electrode of the selection MOS transistor facing the first photoelectric conversion element is different from that of a portion of the gate electrode of the selection MOS transistor facing the second photoelectric conversion element, the amounts of dark current generated in the first and second photoelectric conversion elements may be different from each other. In this embodiment, in order to minimize the difference in dark current due to the asymmetrical layout, the area of the antireflection coating film on the first photoelectric conversion element is made to differ from that of the antireflection coating film on the second photoelectric conversion element. More specifically, the area of the first antireflection coating film 520a is made to be larger than that of the second antireflection coating film 520b.

Antireflection coating films, such as silicon nitride films, generally have a hydrogen absorption effect greater than that of silicon oxide films, which are generally used as interlayer insulation films. If hydrogen radicals are supplied via an antireflection coating film to suppress interface states as described previously, a predetermined proportion of the supplied hydrogen radicals are captured by the antireflection coating film. The capturing amount varies in accordance with the volume of the antireflection coating film. However, because antireflection coating films of the same thickness are individually disposed in the pixels, the capturing amount is determined in accordance with the area of each antireflection coating film. The present inventors have noticed that the hydrogen capturing amount varies in accordance with the area of an antireflection coating film and proposed a method for minimizing the difference in dark current between photoelectric conversion elements due to the difference in length between portions of gate electrode of selection MOS transistors respectively facing these photoelectric conversion elements by controlling the area of each antireflection coating film.

More specifically, it is determined which of the photoelectric conversion elements (e.g., the first and second photoelectric conversion elements) has a shorter portion facing a gate electrode of an adjacent selection MOS transistor, and the area of an antireflection coating film of one (e.g., the first photoelectric conversion element) of these photoelectric conversion elements having the shorter facing portion is made to be larger than that of the other one (e.g., the second photoelectric conversion element) of these photoelectric conversion elements. That is, referring to FIG. 2, the area of the first antireflection coating film 520a (the antireflection coating film 130a in FIG. 3) is made to be larger than that of the second antireflection coating film 520b (the antireflection coating film 130b in FIG. 3).

As a result, as compared with the first photoelectric conversion element, the second photoelectric conversion element has a greater interface state suppression effect obtained by supplying hydrogen. It is therefore possible to minimize the difference in dark current between the first and second photoelectric conversion elements.

If a voltage for bringing the selection MOS transistor into conduction is supplied to the gate electrode of the selection MOS transistor throughout the accumulation period, the dark current difference of several to several tens of percent due to an asymmetrical layout of the gate electrode of the selection MOS transistor may occur. However, according to this embodiment, this dark current difference can be reduced by approximately 30%.

In this embodiment, a description has been made using the selection MOS transistor. However, this embodiment can be applied to another type of transistor in which electric charges functioning to produce a dark current gather in a semiconductor region such as a channel stop region under an element isolation region during at least part of an accumulation period of a photoelectric conversion element. Accordingly, this embodiment can also be applied to a case in which a reset MOS transistor supplies a reset voltage to a gate electrode of an amplifying MOS transistor during part of the accumulation period, because a voltage higher than that applied to the gate electrode in a non-conductive state is applied to the gate electrode. Even if a signal's electric charge is a hole and each MOS transistor is a P-type MOS transistor, all conductivity types are merely reversed in the above description, and the mechanism causing the occurrence of a dark current is not changed. In this case, under the condition that a voltage (pulse) for bringing a MOS transistor into conduction is supplied to the MOS transistor during the accumulation period of a photoelectric conversion element, this embodiment can be applied.

In this embodiment, the configuration of a solid-state image pickup apparatus including the selection MOS transistor and the transfer MOS transistor has been described. Even if a solid-state image pickup apparatus does not include the selection MOS transistor and the transfer MOS transistor, this embodiment can be applied. More specifically, this embodiment can be applied to a case in which a photoelectric conversion element is directly connected to the gate electrode of the amplifying MOS transistor and a case in which the reset MOS transistor performs pixel selection instead of the selection MOS transistor by controlling the potential of the gate electrode of the amplifying MOS transistor. In the latter case, it is required that the total length of portions of the amplifying MOS transistor and the reset MOS transistor facing the first photoelectric conversion element be shorter than that of portions of the amplifying MOS transistor and the reset MOS transistor facing the second photoelectric conversion element.

The layout of the antireflection coating film is not limited to the layouts illustrated in FIGS. 2, 3A, and 3B. However, in consideration of etching damage to a photoelectric conversion element, it is desirable that the end portions of the antireflection coating film be present on the element isolation region. That is, it is desirable that the antireflection coating film cover the whole surface of the photoelectric conversion element and cover the element isolation region or the gate line on the element isolation region.

Second Embodiment

Figure 4:
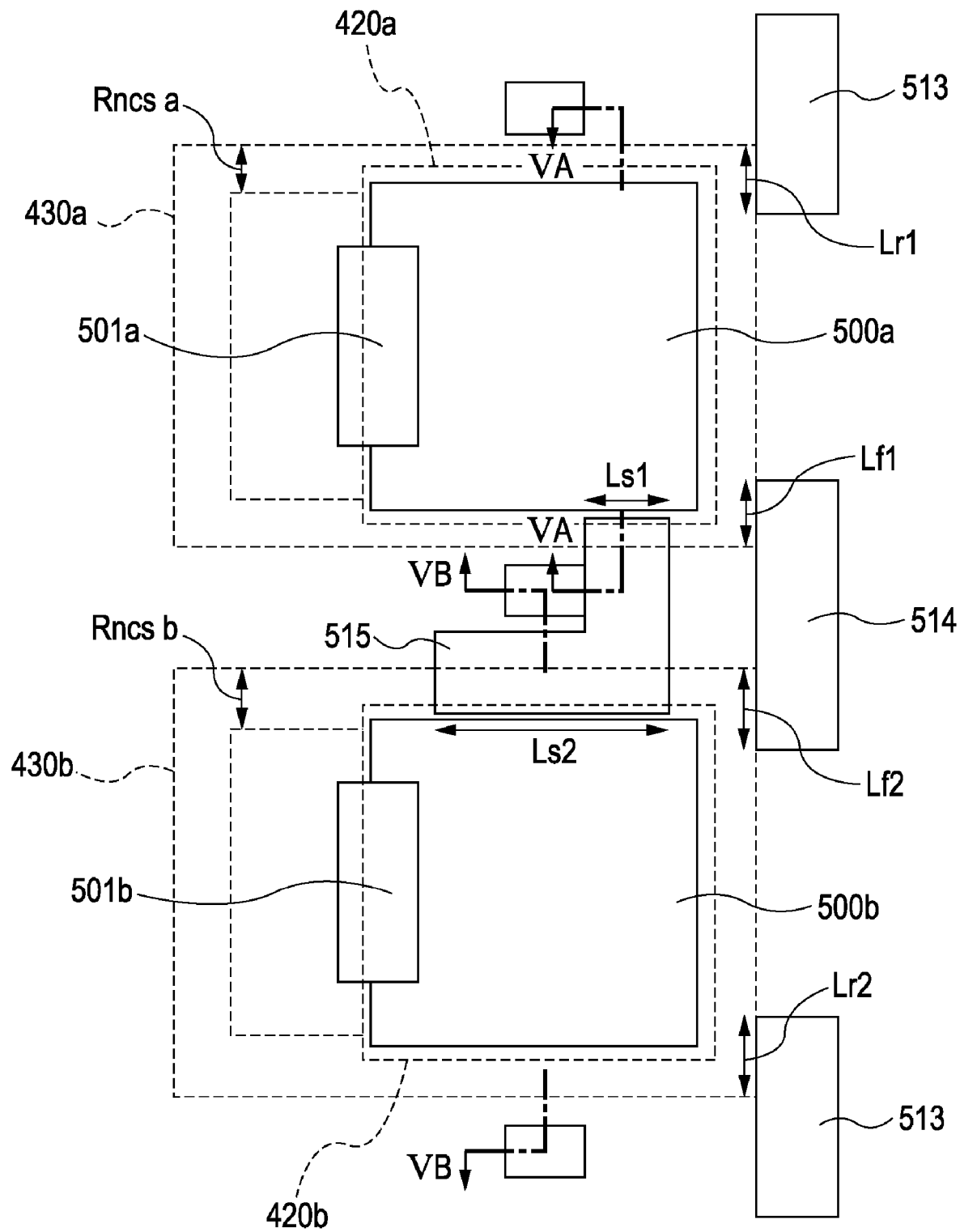
FIG. 4 is a plan view of a solid-state image pickup apparatus according to a second embodiment of the present invention.
Figure 5A:
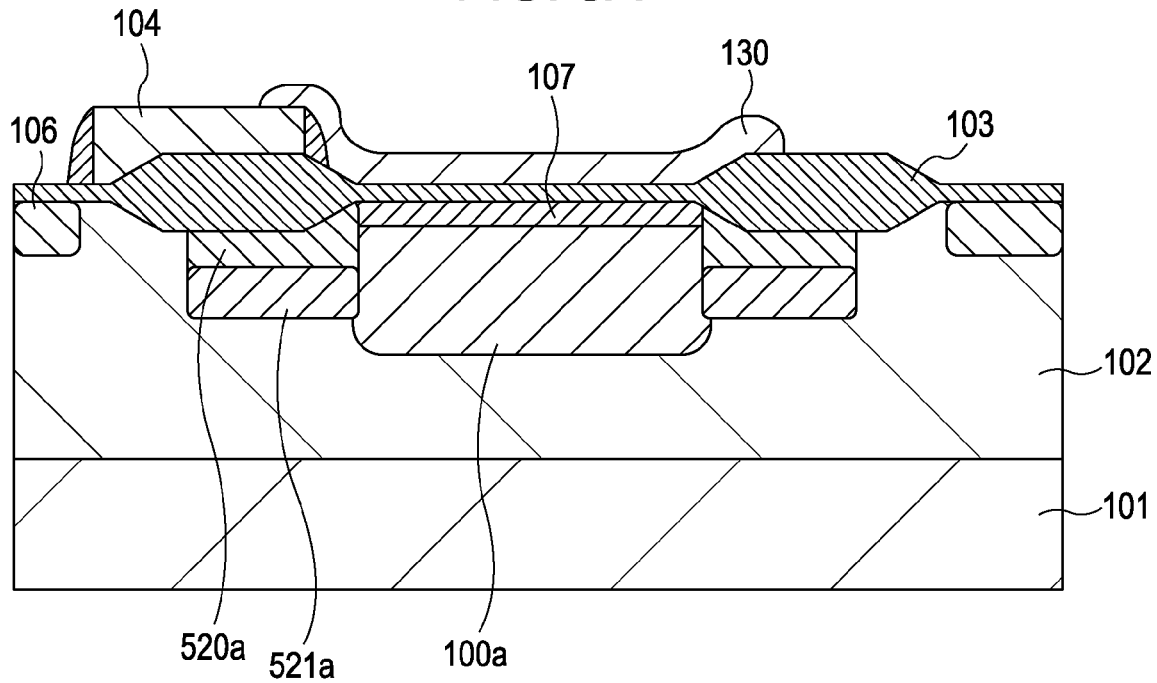
FIGS. 5A and 5B are cross-sectional views of a solid-state image pickup apparatus according to the second embodiment.
Figure 5B:
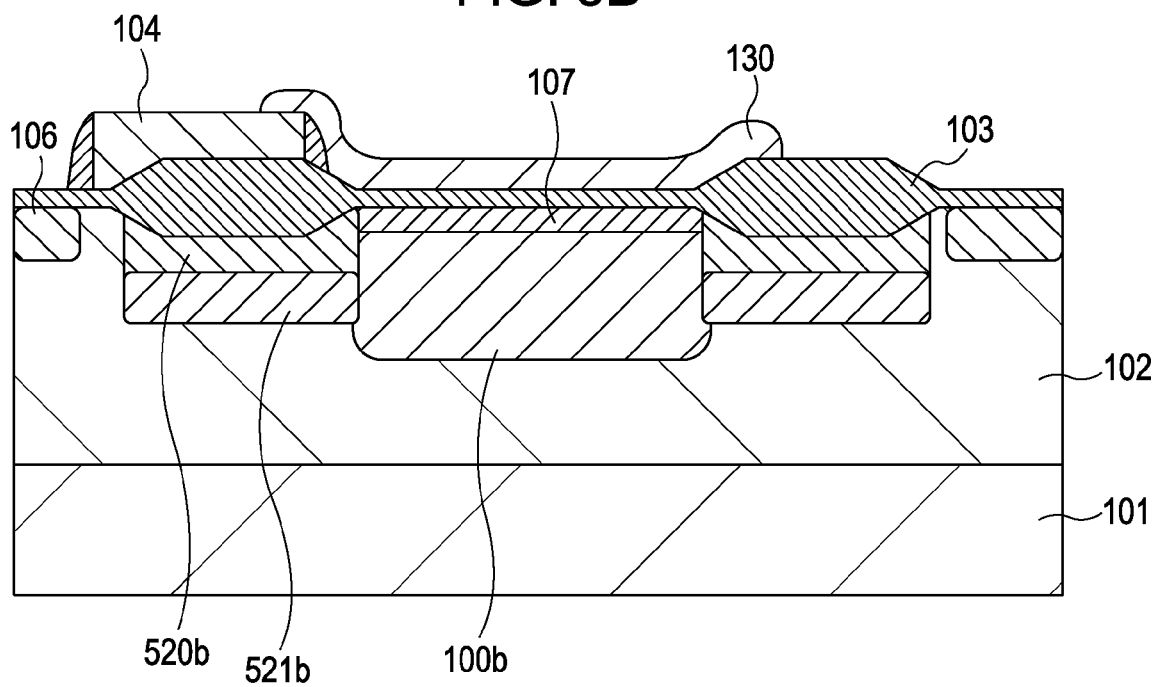

FIG. 4 is a plan view of a solid-state image pickup apparatus according to a second embodiment. FIG. 5A is a cross-sectional view taken along the line VA of FIG. 4, and FIG. 5B is a cross-sectional view taken along the line VB of FIG. 4. The same reference numerals are used to identify parts already described in the first embodiment, and the descriptions thereof will be therefore omitted. In this embodiment, the areas of antireflection coating films are the same, but the areas (widths) of channel stop regions are made to differ from each other. In this embodiment, the area of a channel stop region denotes an area in the top view of the channel stop region.

Like in the first embodiment, in this embodiment, the lengths of portions of respective gate electrodes of MOS transistors that face respective adjacent photoelectric conversion elements are different from each other. Referring to FIG. 4, the length of a portion of a gate electrode of each MOS transistor facing the first photoelectric conversion element including the semiconductor region 500a is different from that of a portion of the gate electrode of the MOS transistor facing the second photoelectric conversion element including the semiconductor region 500b. More specifically, Ls1+Lr1+Lf1<Ls2+Lr2+Lf2 is satisfied. Like in the first embodiment, in this embodiment, the difference in dark current between the first and second photoelectric conversion elements due to an asymmetrical gate layout occurs. In this embodiment, by making the areas (widths) of channel stop regions different from each other without making the areas of antireflection coating films different from each other, the difference in dark current between the first and second photoelectric conversion elements is minimized. The reason why the amount of dark current can be changed by making the areas (widths) of the channel stop regions different from each other will be described. The interface between an element isolation region formed of an insulator required to determine an active region and silicon is apt to become a dark current source under the influence of damage at the time of formation of the element isolation region. By forming the channel stop region, the amount of dark current generated near the interface can be minimized. It is important to form the channel stop region near the interface between the element isolation region and silicon. Accordingly, the width of a channel stop region with respect to the width of the element isolation region in the top view is important. That is, by changing the width of the channel stop region, the region covering the interface between the element isolation region and silicon can be changed. For the above-described reasons, the widths of the channel stop regions are made to differ from each other.

More specifically, referring to FIG. 4, Rncsa representing the width of portions of a channel stop region 430a that are above and below the semiconductor region 500a and Rncsb representing the width of portions of a channel stop region 430b that are above and below the semiconductor region 500b are set so that Rncsa<Rncsb is satisfied. The greater the width of a channel stop region, the larger the amount of reduction of electric charge, that is, the larger the amount of reduction of the dark current. Accordingly, by making the width of the channel stop region 430a adjacent to the first photoelectric conversion element less than that of the channel stop region 430b adjacent to the second photoelectric conversion element, the difference in dark current between the first and second photoelectric conversion elements can be minimized. It is desirable that the widths of channel stop regions near regions having gate facing portions of different lengths be made to differ from each other. More specifically, if the lengths of portions of the gate electrode of the selection MOS transistor facing the first and second photoelectric conversion elements are different from each other, the widths of channel stop regions under element isolation regions on which gate lines of the selection MOS transistor are present are made to differ from each other. Referring to FIG. 4, the widths of the channel stop regions in the vertical direction are made to differ from each other without making the widths of the channel stop regions in the horizontal direction different from each other.

Like in the first embodiment, in this embodiment, the difference in dark current due to the asymmetrical layout can also be minimized.

Third Embodiment

Figure 6:
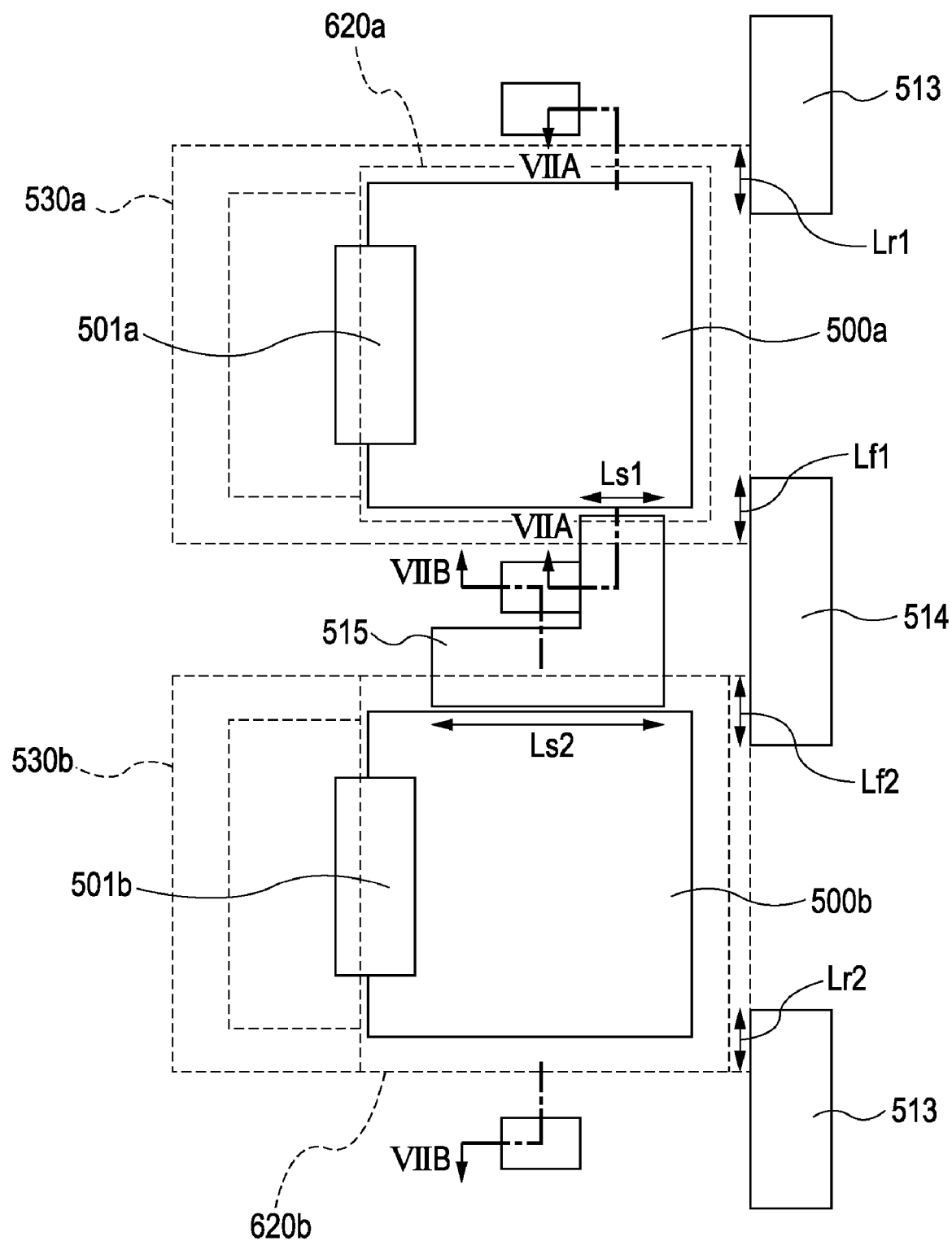
FIG. 6 is a plan view of a solid-state image pickup apparatus according to a third embodiment of the present invention.
Figure 7A:
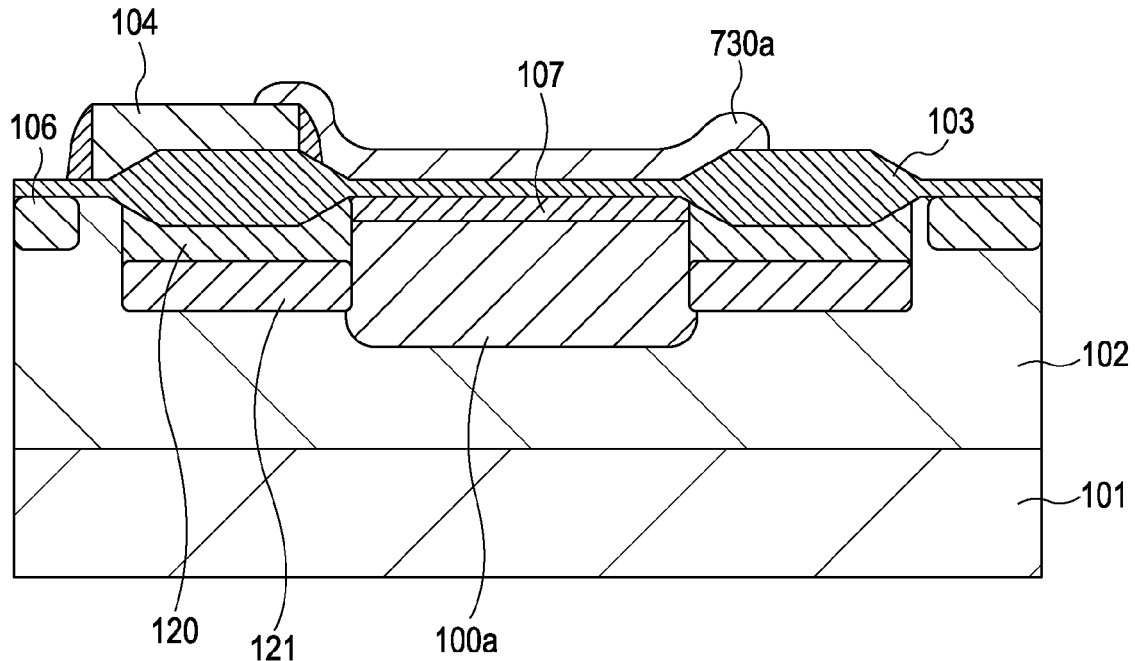
FIGS. 7A and 7B are cross-sectional views of a solid-state image pickup apparatus according to the third embodiment.
Figure 7B:
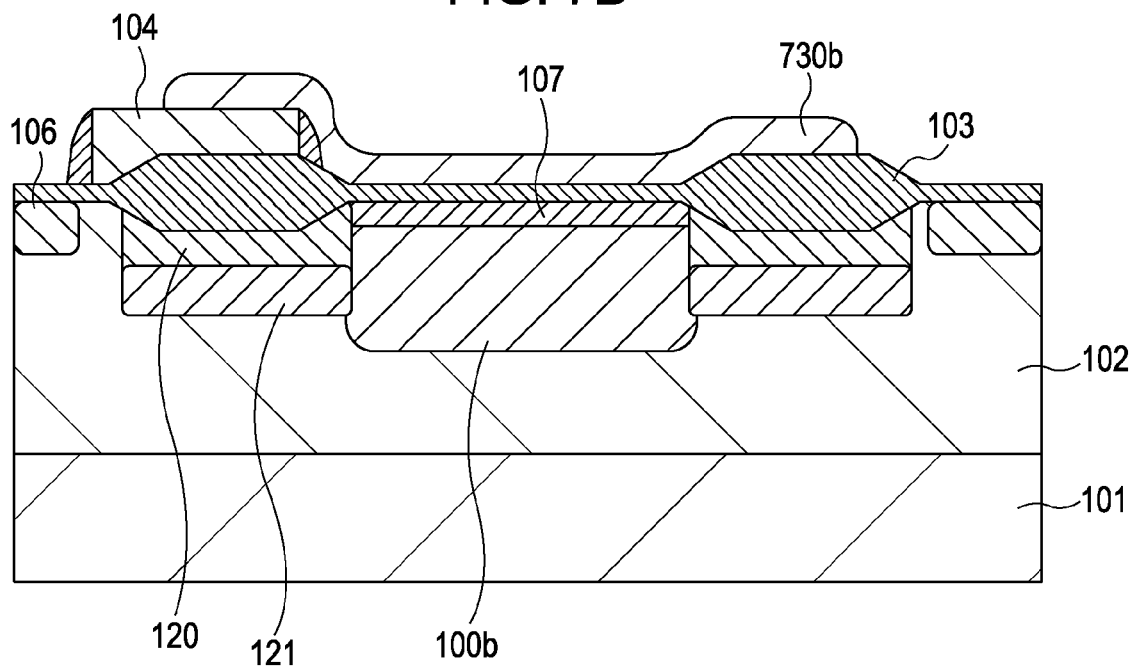

FIG. 6 is a plan view of a solid-state image pickup apparatus according to a third embodiment. FIG. 7A is a cross-sectional view taken along the line VIIA of FIG. 6, and FIG. 7B is a cross-sectional view taken along the line VIIB of FIG. 6. The same reference numerals are used to identify parts already described in the first and second embodiments, and the descriptions thereof will be therefore omitted.

In this embodiment, a case in which a period during which a voltage lower than that in the first and second embodiments (non-conducting voltage) is applied to a gate electrode is long in the accumulation period of a photoelectric conversion element will be described. For example, during the whole accumulation period of each photoelectric conversion element, a voltage for bringing a MOS transistor out of conduction is applied to the gate electrodes of a plurality of MOS transistors. These MOS transistors are disposed for each photoelectric conversion element, and include a signal reading MOS transistor and a reset transistor.

Like in the above-described embodiments, in this embodiment, the length of a portion of a gate electrode adjacent to the first photoelectric conversion element is different from that of a portion of the gate electrode adjacent to the second photoelectric conversion element. More specifically, Ls1+Lr1+Lf1<Ls2+Lr2+Lf2 is satisfied.

In this embodiment, because the period during which a voltage for bringing a MOS transistor out of conduction is applied to a gate electrode of each MOS transistor is long in the accumulation period, the difference in dark current due to an asymmetrical layout is smaller than that in the first and second embodiments. However, if image capturing is performed at a low luminance level or in a long exposure mode (long accumulation mode), the small difference in dark current can affect a captured image.

The difference in electric charge state between a region under an element isolation region on which a gate line is formed and a region under an element isolation region on which a gate line is not formed will be described. The number of electrons in the region under the element isolation region on which a gate line is formed is smaller than that in the region under the element isolation region on which a gate line is not formed. Accordingly, the amount of dark current generated in the region under the element isolation region on which a gate line is formed is smaller than that generated in the region under the element isolation region on which a gate line is not formed. In order to minimize the difference in dark current, the area of the antireflection coating film formed on a photoelectric conversion element having a longer portion adjacent to a gate electrode, that is, on the second photoelectric conversion element in this embodiment, is made to be larger than that of the antireflection coating film formed on the first photoelectric conversion element. The area of an antireflection coating film 620b (730b in FIG. 7B) is larger than that of an antireflection coating film 620a (730a in FIG. 7A). That is, the area of the antireflection coating film 620b (730b) formed on the second photoelectric conversion element including the semiconductor region 500b (100b in FIG. 7B) is larger than that of the antireflection coating film 620a (730a) formed on the first photoelectric conversion element including the semiconductor region 500a (100a in FIG. 7A).

According to this embodiment, the difference in dark current due to the asymmetrical gate layout can be minimized. The layout of the antireflection coating films is not limited to the layout illustrated in FIGS. 6, 7A, and 7B. However, like in the first embodiment, in consideration of etching damage to a photoelectric conversion element, it is desirable that the end portions of the antireflection coating film be present on the element isolation region. That is, it is desirable that the antireflection coating film cover the whole surface of the photoelectric conversion element, and the area of the antireflection coating film be controlled by changing a region covering the element isolation region or a gate electrode on the element isolation region.

Fourth Embodiment

Figure 8:
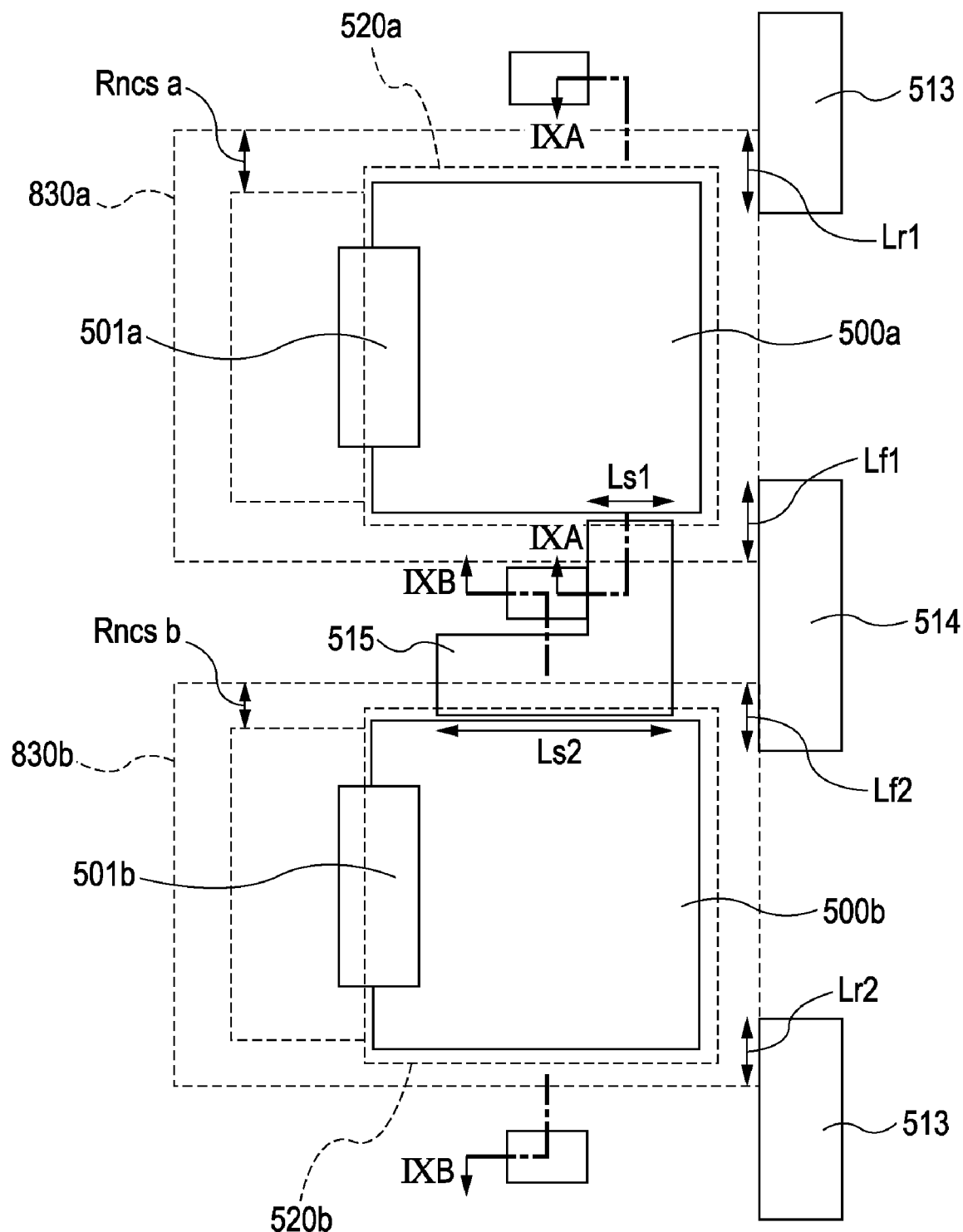
FIG. 8 is a plan view of a solid-state image pickup apparatus according to a fourth embodiment of the present invention.
Figure 9A:
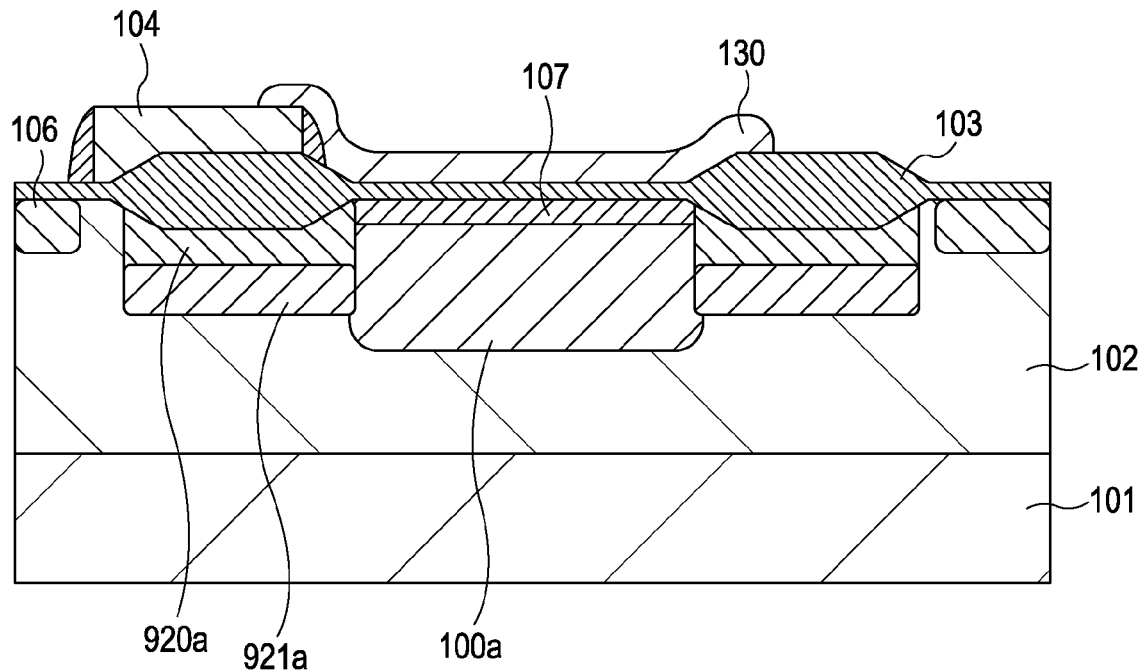
FIGS. 9A and 9B are cross-sectional views of a solid-state image pickup apparatus according to the fourth embodiment.
Figure 9B:
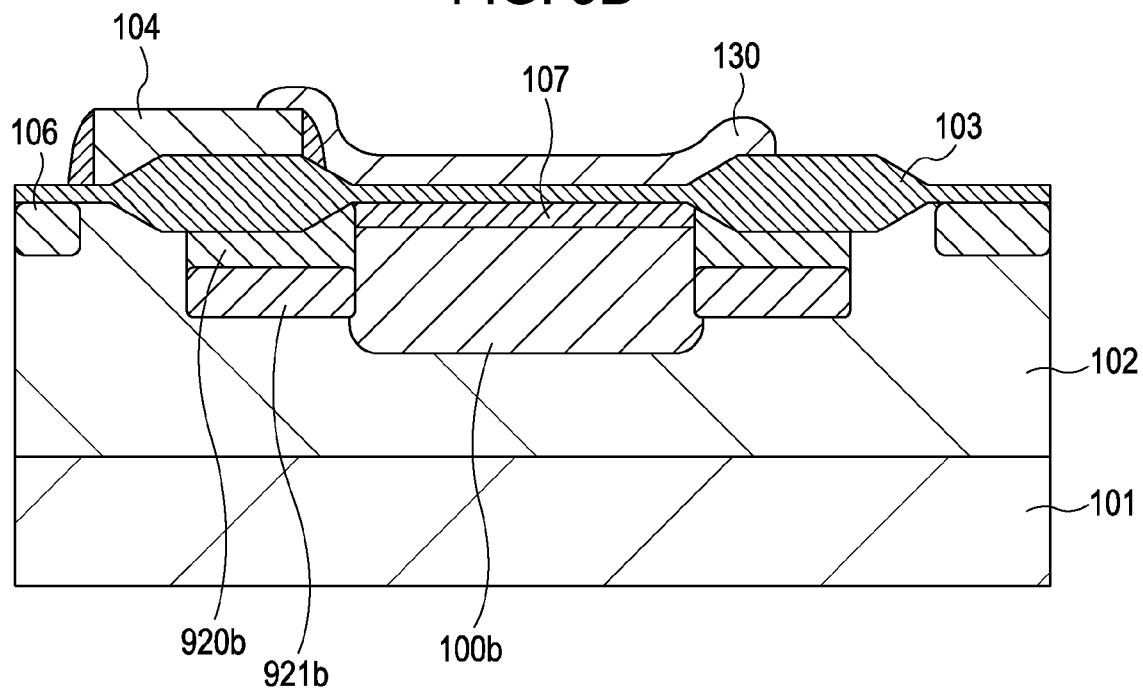

FIG. 8 is a plan view of a solid-state image pickup apparatus according to a fourth embodiment. FIG. 9A is a cross-sectional view taken along the line IXA of FIG. 8, and FIG. 9B is a cross-sectional view taken along the line IXB of FIG. 8. The same reference numerals are used to identify parts already described in the first, second, and third embodiments, and the descriptions thereof will be therefore omitted. In this embodiment, like in the third embodiment, a voltage is similarly applied to a gate electrode. The difference in dark current is minimized by changing the width of a channel stop region. Referring to FIG. 8, a channel stop region 830a is adjacent to the first photoelectric conversion element, and a channel stop region 830b is adjacent to the second photoelectric conversion element. Referring to FIGS. 9A and 9B, channel stop regions 920a and 921a are adjacent to the first photoelectric conversion element, and channel stop regions 920b and 921b are adjacent to the second photoelectric conversion element. As is apparent from FIGS. 8, 9A, and 9B, the width of the channel stop region 920a adjacent to the first photoelectric conversion element is made to be greater than that of the channel stop region 920b adjacent to the second photoelectric conversion element. Like in the second embodiment, it is desirable that the widths of channel stop regions near regions having gate facing portions of different lengths be made to differ from each other. More specifically, if the lengths of portions of the gate electrodes of the selection MOS transistors facing the first and second photoelectric conversion elements are different from each other, the widths of channel stop regions under element isolation regions in which the selection MOS transistors are present are made to differ from each other. Referring to FIG. 8, the widths of the channel stop regions in the vertical direction are made to differ from each other without making the widths of the channel stop regions in the horizontal direction different from each other.

Fifth Embodiment

Figure 10:
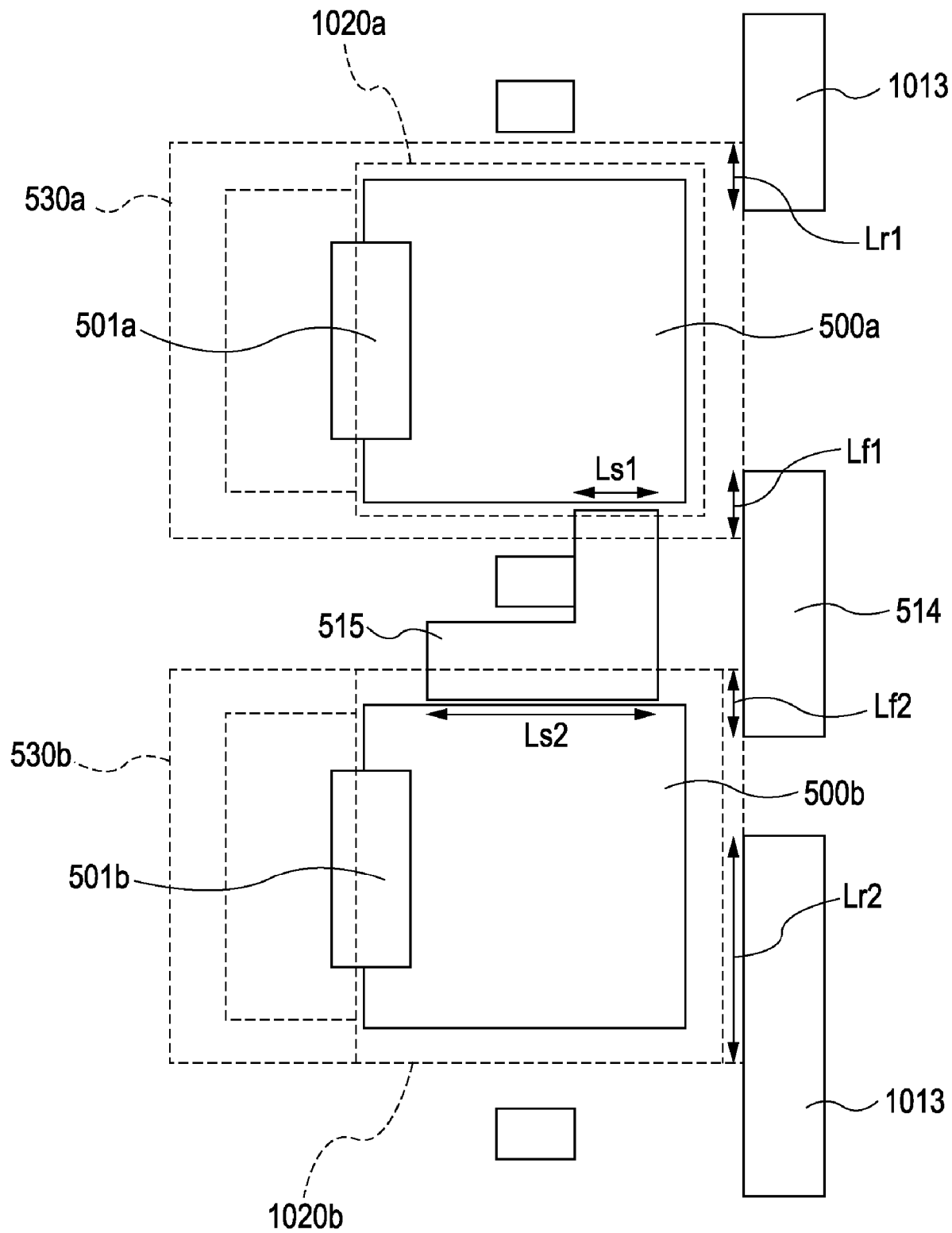
FIG. 10 is a plan view of a solid-state image pickup apparatus according to a fifth embodiment of the present invention.

FIG. 10 is a plan view of a solid-state image pickup apparatus according to a fifth embodiment. The same reference numerals are used to identify parts already described in the first to fourth embodiments, and the descriptions thereof will be therefore omitted. In this embodiment, the shape of a gate electrode 1013 of a reset MOS transistor is different from that of the gate electrode of the reset MOS transistor according to the first to fourth embodiments. Like in the fourth embodiment, a voltage is similarly applied to the gate electrode of each MOS transistor during the accumulation period.

If there is one type of MOS transistor having a gate electrode to which a voltage for bringing the MOS transistor into conduction is applied during the accumulation period and there is another type of MOS transistor having a gate electrode to which a voltage for bringing the MOS transistor out of conduction is applied during the accumulation period, it is required to focus attention on the layout of the former type of MOS transistor having a gate electrode to which a voltage for bringing the MOS transistor into conduction is applied during the accumulation period. The reason for this is that MOS transistors of the former type more greatly affect the difference in dark current.

In this embodiment, a length Lr2 of a portion of the gate electrode of the reset MOS transistor facing the semiconductor region 500b (the second photoelectric conversion element) is longer than a length Lf1 of a portion of the gate electrode of the amplifying MOS transistor facing the semiconductor region 500a (the first photoelectric conversion element). During part of the accumulation period, a high voltage is applied to the gate electrode of the reset MOS transistor. Accordingly, by making the area of an antireflection coating film 1020b larger than that of an antireflection coating film 1020a, the difference in dark current between the semiconductor region 500a (the first photoelectric conversion element) and the semiconductor region 500b (the second photoelectric conversion element) can be minimized.

Figure 11:
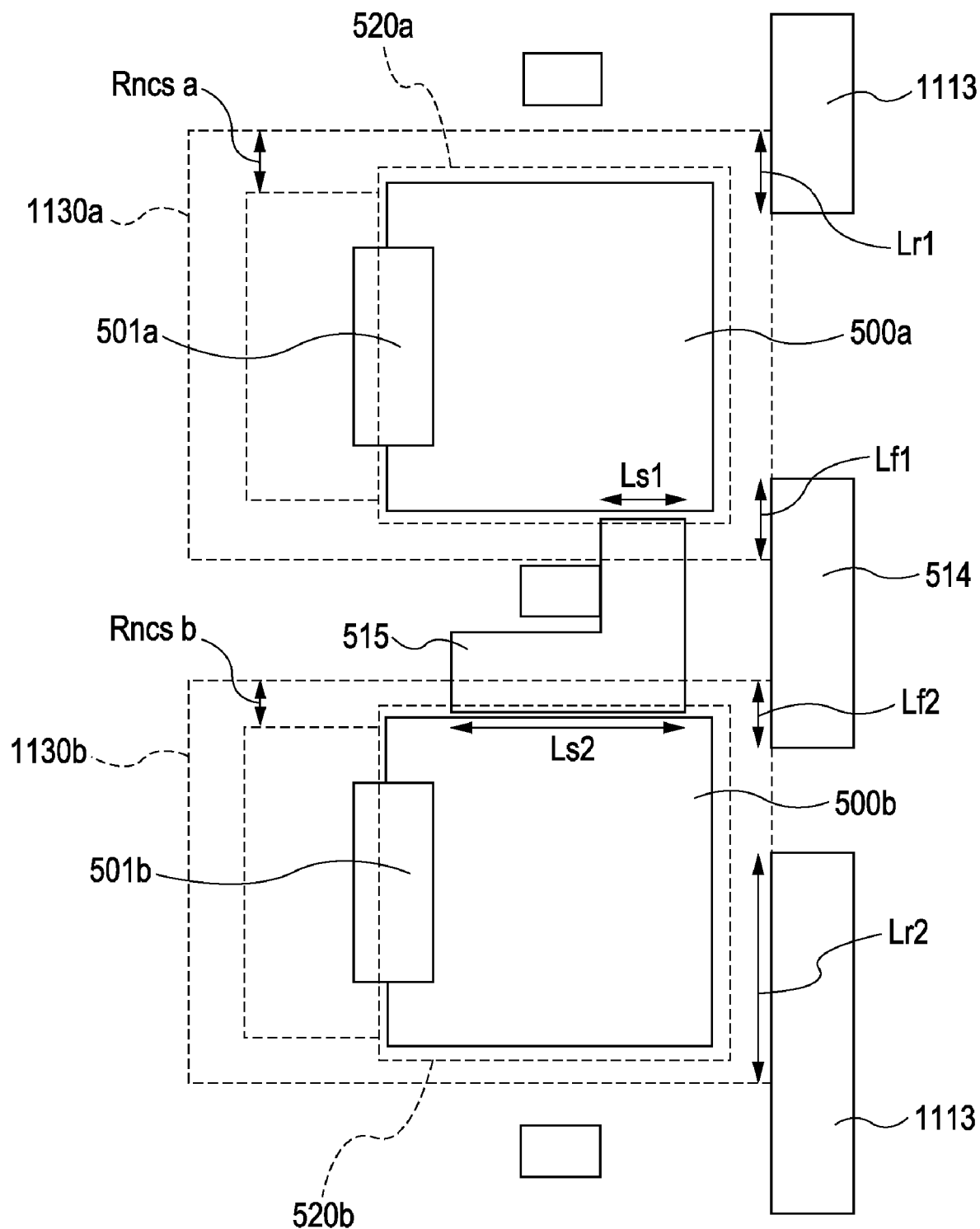
FIG. 11 is a plan view illustrating an exemplary modification of a solid-state image pickup apparatus according to the fifth embodiment.

Referring to FIG. 11, in order to minimize the difference in dark current, a width Rncsa of a channel stop region 1130a and a width Rncsb of a channel stop region 1130b are made to differ from each other. Cross sections of the solid-state image pickup apparatus illustrated in FIG. 10 are the same as those described previously with reference to the previous embodiments, and the description thereof will be therefore omitted. A gate electrode 1113 is a gate electrode of a reset MOS transistor.

As illustrated in FIGS. 10 and 11, if a voltage for bringing a MOS transistor into conduction (i.e., a conducting voltage) is applied to the gate electrodes of different MOS transistors during the accumulation period, the integration is performed for a period during which the conducting voltage is supplied and the length of a portion of each of the gate electrodes facing a photoelectric conversion element. The difference in dark current in a case where the areas of the antireflection coating films are the same and the widths of the channel stop regions are the same is calculated. The areas of the antireflection coating films or the channel stop regions are made to differ from each other so that the calculated difference in dark current can be reduced.

Sixth Embodiment

Figure 12:
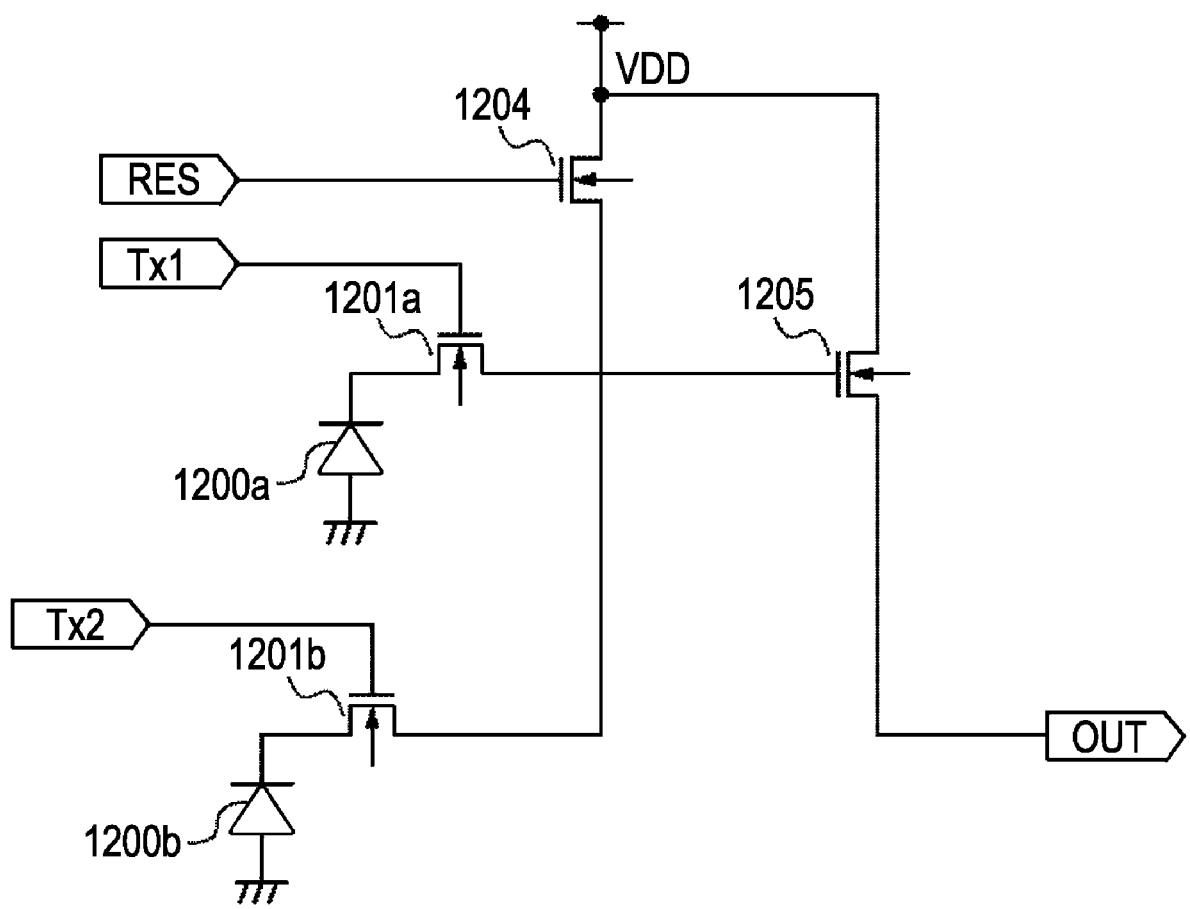
FIG. 12 is a diagram illustrating an equivalent circuit of a solid-state image pickup apparatus according to a sixth embodiment of the present invention.
Figure 13:
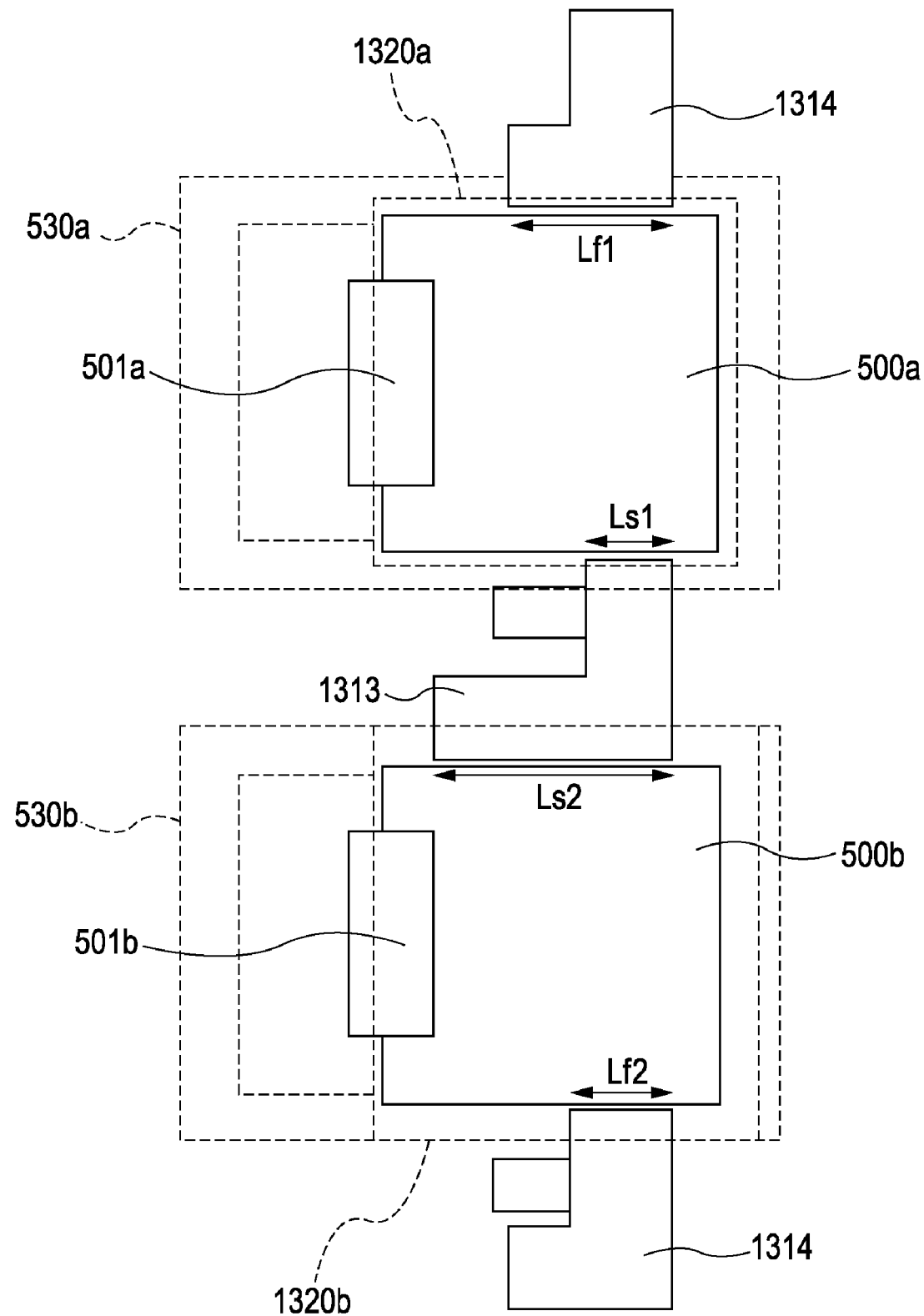
FIG. 13 is a plan view of a solid-state image pickup apparatus according to the sixth embodiment.

FIG. 12 is a diagram illustrating the equivalent circuit of a solid-state image pickup apparatus according to a sixth embodiment. FIG. 13 is a plan view of a solid-state image pickup apparatus having the equivalent circuit illustrated in FIG. 12. The same reference numerals are used to identify parts already described in the first to fifth embodiments, and the descriptions thereof will be therefore omitted. In this embodiment, an exemplary case in which pixel selection is performed by controlling the potential of a gate electrode of an amplifying MOS transistor functioning as an input portion of a pixel amplification portion will be described. More specifically, by causing a reset MOS transistor 1204 to supply at least two different voltages, that is, a pixel selection voltage and a pixel non-selection voltage, to the gate electrode of an amplifying MOS transistor 1205, a pixel selection operation is performed. In this embodiment, there is no selection MOS transistor. Accordingly, the number of MOS transistors disposed in a pixel region is further reduced as compared with the first to fifth embodiments, and this is advantageous for the size reduction of each pixel. However, because a single transistor performs a plurality of functions, the flexibility of driving timing is reduced. That is, it is impossible to set a long period during which a low voltage for bringing a MOS transistor out of conduction is supplied to the gate electrode of the MOS transistor in the accumulation period so as to reduce the amount of dark current. In such a configuration, because the number of gate electrodes to which a high voltage is supplied is increased, the difference in dark current due to the asymmetrical layout tends to increase.

Referring to FIG. 12, photoelectric conversion elements 1200a and 1200b, transfer MOS transistors 1201a and 1201b, the reset MOS transistor 1204, and the amplifying MOS transistor 1205 are illustrated. In this embodiment, the positions of a reset MOS transistor 1313 and an amplifying transistor 1314 are different from those in the previous embodiments. If pixel selection is performed by causing the reset MOS transistor to control the potential of the gate electrode of the amplifying MOS transistor, a low voltage is supplied to the gate electrode of the reset MOS transistor during the accumulation period. A high voltage is supplied to the gate electrode of the amplifying MOS transistor during part of the accumulation period. Accordingly, the difference in length between the gate electrodes of the amplifying transistors 1314 facing the first and second photoelectric conversion elements greatly affects the difference in dark current. A length Lf2 of a gate electrode adjacent to the semiconductor region 500b (e.g., the second photoelectric conversion element) is shorter than a length Lf1 of a gate electrode adjacent to the semiconductor region 500a (e.g., the first photoelectric conversion element). Accordingly, the area of an antireflection coating film 1320a is made to be smaller than that of an antireflection coating film 1320b. Thus, by making the areas of these antireflection coating films different from each other, the difference in dark current can be reduced.

Figure 14:
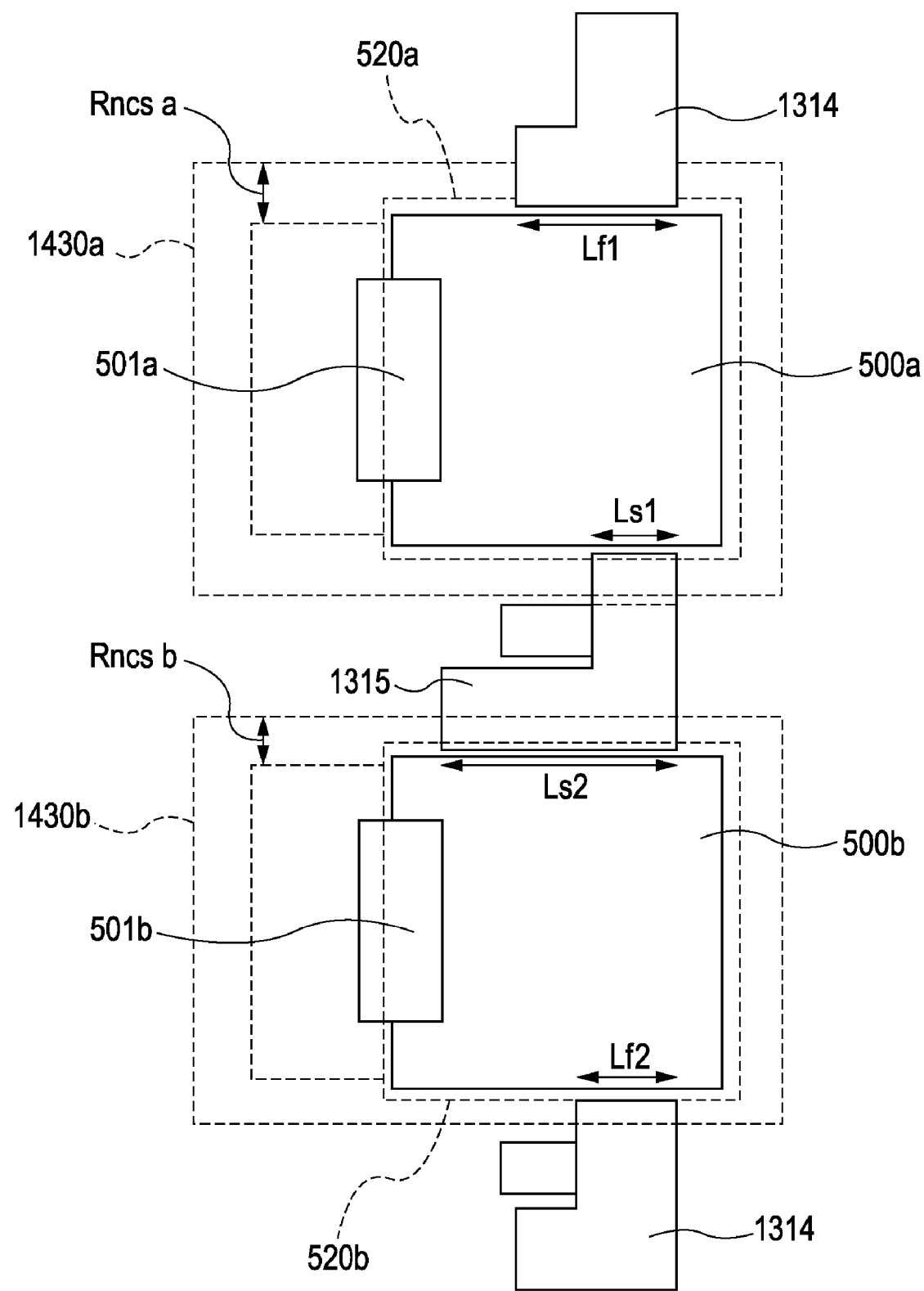
FIG. 14 is a plan view illustrating an exemplary modification of a solid-state image pickup apparatus according to the sixth embodiment.

Referring to FIG. 14, the layout of gate electrodes of MOS transistors is the same as that illustrated in FIG. 13. The widths of channel stop regions 1430a and 1430b are made to differ from each other. A width Rncsa of the channel stop region 1430a adjacent to the first photoelectric conversion element is made to be greater than a width Rncsb of the channel stop region 1430b adjacent to the second photoelectric conversion element. In such a configuration, like in the case described previously with reference to FIG. 13, the difference in dark current can be reduced.

Seventh Embodiment

Figure 15:
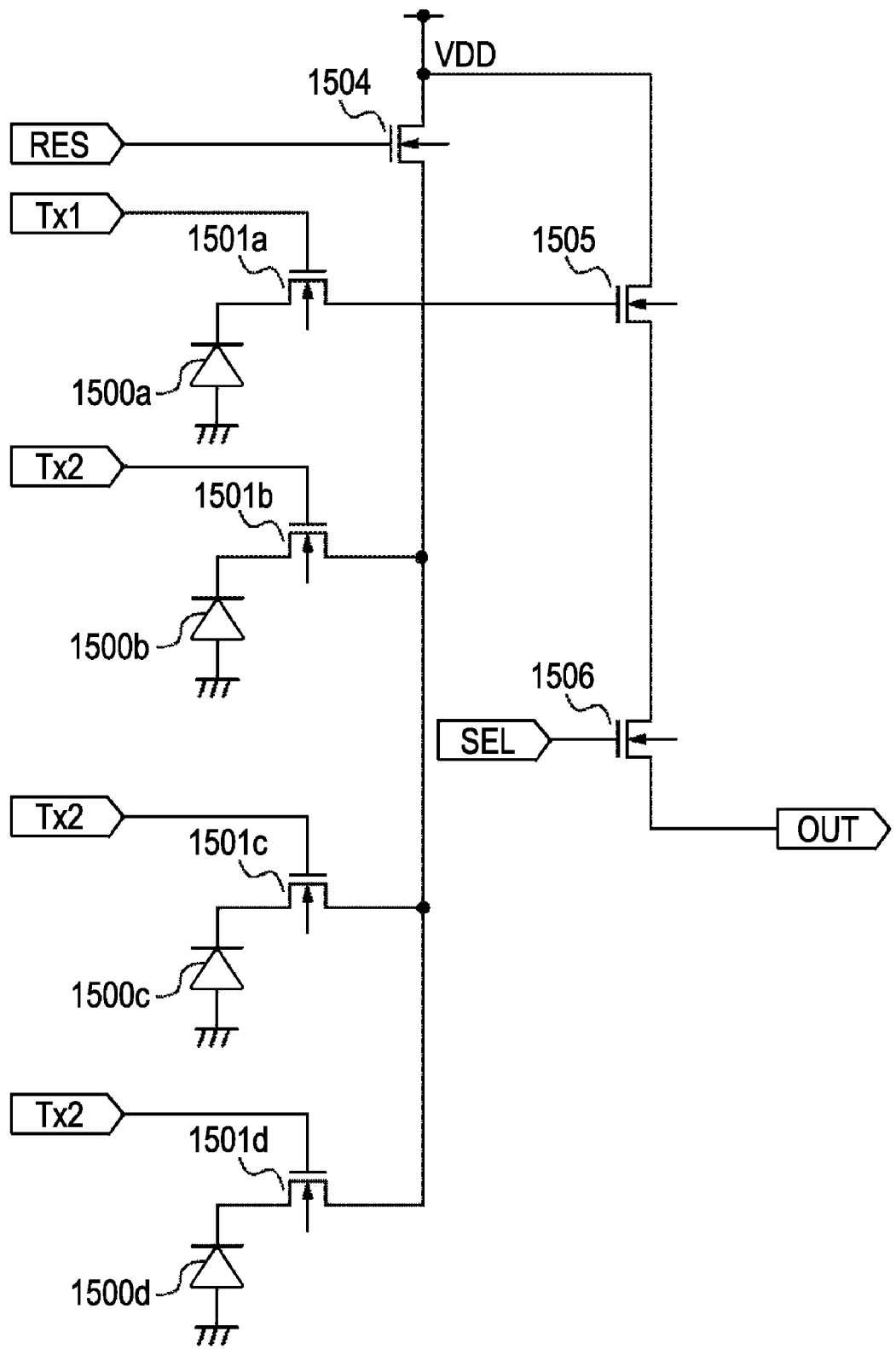
FIG. 15 is a diagram illustrating an equivalent circuit of a solid-state image pickup apparatus according to a seventh embodiment of the present invention.
Figure 16:
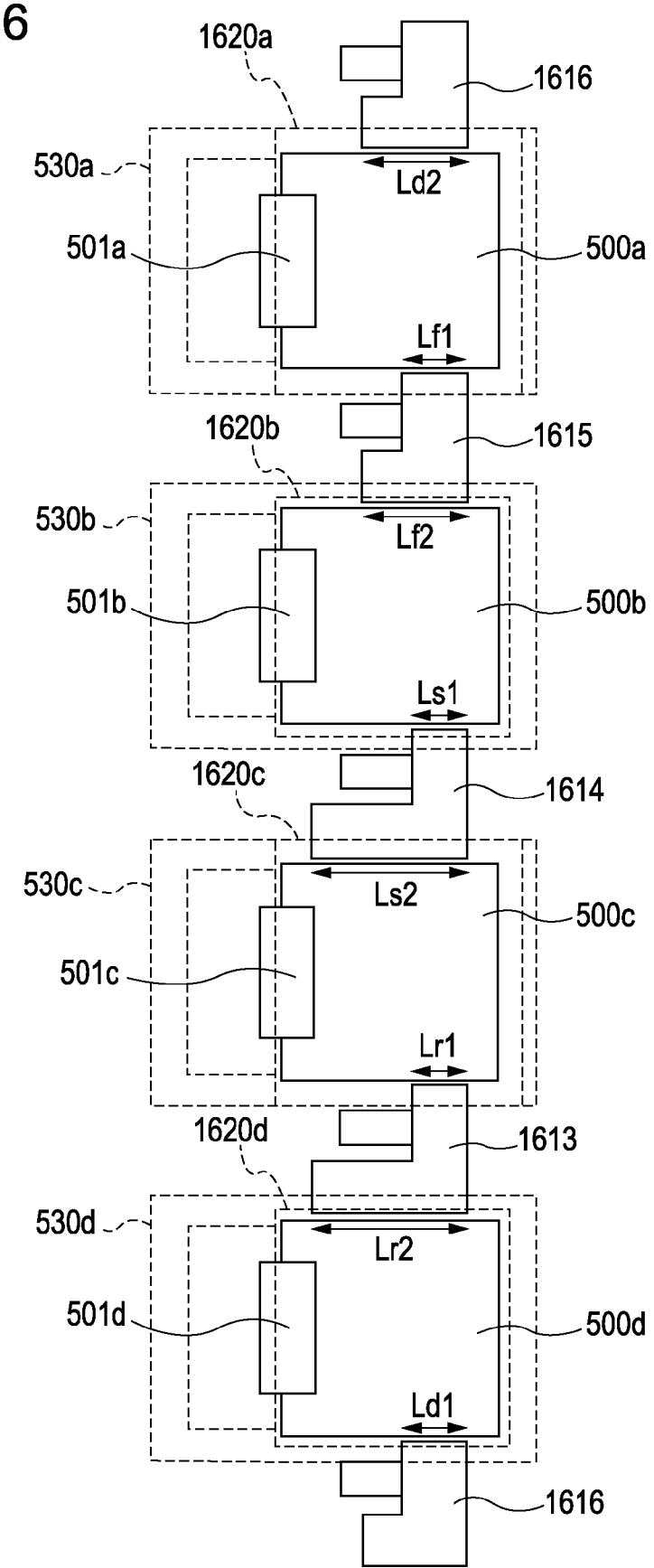
FIG. 16 is a plan view of a solid-state image pickup apparatus according to the seventh embodiment.

FIG. 15 is a diagram illustrating the equivalent circuit of a solid-state image pickup apparatus according to a seventh embodiment. FIG. 16 is a plan view of a solid-state image pickup apparatus having the equivalent circuit illustrated in FIG. 15. The same reference numerals are used to identify parts already described in the first to sixth embodiments, and the descriptions thereof will be therefore omitted. In this embodiment, four photoelectric conversion elements share a pixel reading circuit.

Referring to FIG. 15, photoelectric conversion elements 1500a to 1500d share a pixel reading circuit composed of a reset MOS transistor 1504, an amplifying MOS transistor 1505, and a selection MOS transistor 1506. Transfer MOS transistors 1501a to 1501d also are illustrated.

Referring to FIG. 16, in order to improve the asymmetrical layout of gate electrodes of MOS transistors, a dummy gate electrode 1616 is disposed. The dummy gate electrode 1616 has no circuit function. During the accumulation period, a high voltage is supplied to the gate electrodes of the reset MOS transistor and the amplifying MOS transistor, and a low voltage is supplied to the gate electrode of the selection MOS transistor. Antireflection coating films 1620a to 1620d, a gate electrode 1613 of a reset MOS transistor, a gate electrode 1614 of an amplifying MOS transistor, and a gate electrode 1615 of a selection MOS transistor are illustrated.

The lengths of gate electrodes adjacent to photoelectric conversion elements are Lf1+Ld2, Ls1+Lf2, Lr1+Ls2, and Ld1+Lr2. If photoelectric conversion elements are arranged in descending order of length of a gate electrode to which a high voltage is supplied, photoelectric conversion elements 500c, 500d, 500b, and 500a are arranged in this order. On the basis of the difference in gate length, the areas of the antireflection coating films 1620a to 1620d are set so that 1620a>1620b>1620d>1620c is satisfied. In such a configuration, the difference in dark current can be reduced. Although not illustrated in the drawing, like in the previous embodiments, by making the lengths of channel stop regions different from each other, the difference in dark current can be reduced.

Although the present invention has been described in detail with reference to specific embodiments, it is to be understood that the invention is not limited to the disclosed specific embodiments. Modifications and combinations of the embodiments can be made by those skilled in the art without departing from the scope of the present invention. For example, in the above-described embodiments and the drawings, a solid-state image pickup apparatus including both of the antireflection coating film and the channel stop region has been described. However, the present invention can be applied to a solid-state image pickup apparatus including only one of the antireflection coating film and the channel stop region. Furthermore, if a solid-state image pickup apparatus includes both of the antireflection coating film and the channel stop region, the area or width of one of the antireflection coating film and the channel stop region or the area or width of both of the antireflection coating film and the channel stop region may be changed. The combination used to reduce the difference in dark current may be changed as appropriate.

A solid-state image pickup apparatus in which a plurality of photoelectric conversion elements share MOS transistors included in a pixel reading circuit has been described. However, the present invention can be applied to any solid-state image pickup apparatus in which there is an asymmetrical layout of MOS transistors. That is, the present invention can be applied to a solid-state image pickup apparatus in which a pixel reading circuit composed of the same number of MOS transistors is provided for each photoelectric conversion element.

Furthermore, if a hole is used as a signal's electric charge, the present invention can be applied to a solid-state image pickup apparatus in which the conductivity type of each semiconductor region and the voltage relationship are reversed.

This application claims the benefit of Japanese Patent Application No. 2008-071597 filed Mar. 19, 2008, which is hereby incorporated by reference herein in its entirety.

What is claimed is:

1. A solid-state image pickup apparatus that includes a plurality of cells, each cell including at least a plurality of photoelectric conversion elements, an amplifying MOS transistor for amplifying a signal corresponding to an electric charge of each of the plurality of photoelectric conversion elements and outputting an amplified signal, and a reset MOS transistor for supplying a reference voltage to the amplifying MOS transistor so as to set a potential of a gate electrode of the amplifying MOS transistor to a reference potential, the solid-state image pickup apparatus comprising:
    a first antireflection coating film that is formed on a light-receiving surface of a first photoelectric conversion element and is configured to suppress reflection of light at an interface between the first photoelectric conversion element and an interlayer insulation film; and
    a second antireflection coating film that is formed on a light-receiving surface of a second photoelectric conversion element and is configured to suppress reflection of light at an interface between the second photoelectric conversion element and an interlayer insulation film, and
    wherein a total length of first photoelectric conversion element facing portions of gate lines of an amplifying MOS transistor and a reset MOS transistor, which are disposed on an element isolation region adjacent to the first photoelectric conversion element, is shorter than a total length of second photoelectric conversion element facing portions of gate lines of the amplifying MOS transistor and the reset MOS transistor, which are disposed on an element isolation region adjacent to the second photoelectric conversion element, and
    wherein an area of the first antireflection coating film is larger than that of the second antireflection coating film.

2. The solid-state image pickup apparatus according to claim 1, wherein, in each cell, the amplifying MOS transistor is shared between the first and second photoelectric conversion elements.

3. The solid-state image pickup apparatus according to claim 1, wherein, in each cell, a voltage for bringing a MOS transistor into conduction is supplied to a gate electrode of the amplifying MOS transistor or the reset MOS transistor during an electric charge accumulation period of each of the plurality of photoelectric conversion elements.

4. The solid-state image pickup apparatus according to claim 1, wherein, in each cell, the plurality of photoelectric conversion elements further includes third and fourth photoelectric conversion elements, and the amplifying MOS transistor is shared among the first, second, third, and fourth photoelectric conversion elements.

5. The solid-state image pickup apparatus according to claim 1, wherein each cell further includes a selection MOS transistor configured to control a signal reading from the amplifying MOS transistor.

6. The solid-state image pickup apparatus according to claim 1,
    wherein each cell further includes a transfer MOS transistor configured to transfer an electric charge of each of the plurality of photoelectric conversion elements to a gate electrode of the amplifying MOS transistor, and
    wherein the reset MOS transistor controls a potential of the gate electrode of the amplifying MOS transistor, whereby the signal reading from the amplifying MOS transistor is controlled.

7. A solid-state image pickup apparatus that includes a plurality of cells, each cell including at least a plurality of photoelectric conversion elements including a first photoelectric conversion element and a second photoelectric conversion element, an amplifying MOS transistor for amplifying a signal corresponding to an electric charge of each of the first and second photoelectric conversion elements and outputting an amplified signal, and a reset MOS transistor for supplying a reference voltage to the amplifying MOS transistor so as to set a potential of a gate electrode of the amplifying MOS transistor to a reference potential, the solid-state image pickup apparatus comprising:
    a first channel stop region that is formed under an element isolation region adjacent to the first photoelectric conversion element so that the first channel stop region is adjacent to the first photoelectric conversion element; and
    a second channel stop region that is formed under an element isolation region adjacent to the second photoelectric conversion element so that the second channel stop region is adjacent to the second photoelectric conversion element,
    wherein a total length of first photoelectric conversion element facing portions of gate lines of the amplifying MOS transistor and the reset MOS transistor, which are disposed on the element isolation region adjacent to the first photoelectric conversion element, is shorter than a total length of second photoelectric conversion element facing portions of gate lines of the amplifying MOS transistor and the reset MOS transistor, which are disposed on the element isolation region adjacent to the second photoelectric conversion element, and wherein a width of the first channel stop region is less than that of the second channel stop region.

8. The solid-state image pickup apparatus according to claim 7, wherein, in each cell, the amplifying MOS transistor is shared between the first and second photoelectric conversion elements.

9. The solid-state image pickup apparatus according to claim 7, wherein, in each cell, a voltage for bringing a MOS transistor into conduction is supplied to the gate electrode of the amplifying MOS transistor or a gate electrode of the reset MOS transistor during an electric charge accumulation period of each of the plurality of photoelectric conversion elements.

10. The solid-state image pickup apparatus according to claim 7, wherein, in each cell, the plurality of photoelectric conversion elements further includes third and fourth photoelectric conversion elements, and the amplifying MOS transistor is shared among the first, second, third, and fourth photoelectric conversion elements.

11. The solid-state image pickup apparatus according to claim 7, wherein each cell further includes a selection MOS transistor configured to control a signal reading from the amplifying MOS transistor.

12. The solid-state image pickup apparatus according to claim 7,
wherein each cell further includes a transfer MOS transistor configured to transfer an electric charge of each of the plurality of photoelectric conversion elements to the gate electrode of the amplifying MOS transistor, and
wherein the reset MOS transistor controls a potential of the gate electrode of the amplifying MOS transistor, whereby the signal reading from the amplifying MOS transistor is controlled.

13. A solid-state image pickup apparatus including a plurality of photoelectric conversion elements and a plurality of MOS transistors for reading a signal corresponding to an electric charge of a photoelectric conversion element for each of the plurality of photoelectric conversion elements, the solid-state image pickup apparatus comprising:
a first antireflection coating film that is formed on a light-receiving surface of a first photoelectric conversion element and is configured to suppress reflection of light at an interface between the first photoelectric conversion element and an interlayer insulation film; and
a second antireflection coating film that is formed on a light-receiving surface of a second photoelectric conversion element and is configured to suppress reflection of light at an interface between the second photoelectric conversion element and an interlayer insulation film, and wherein a total length of first photoelectric conversion element facing portions of gate lines of the plurality of MOS transistors, which are disposed on an element isolation region adjacent to the first photoelectric conversion element, is shorter than a total length of second photoelectric conversion element facing portions of gate lines of the plurality of MOS transistors, which are disposed on an element isolation region adjacent to the second photoelectric conversion element,
wherein a voltage for bringing a MOS transistor out of conduction is supplied to a gate electrode of each of the plurality of MOS transistors during a whole accumulation period of each of the plurality of photoelectric conversion elements, and
wherein an area of the first antireflection coating film is smaller than that of the second antireflection coating film.

14. A solid-state image pickup apparatus including a plurality of photoelectric conversion elements and a plurality of MOS transistors for reading a signal corresponding to an electric charge of a photoelectric conversion element for each of the plurality of photoelectric conversion elements, the solid-state image pickup apparatus comprising:
a first channel stop region that is formed under an element isolation region adjacent to a first photoelectric conversion element so that the first channel stop region is adjacent to the first photoelectric conversion element; and
a second channel stop region that is formed under an element isolation region adjacent to a second photoelectric conversion element so that the second channel stop region is adjacent to the second photoelectric conversion element, and
wherein a total length of first photoelectric conversion element facing portions of gate lines of the plurality of MOS transistors, which are disposed on an element isolation region adjacent to the first photoelectric conversion element, is shorter than a total length of second photoelectric conversion element facing portions of gate lines of the plurality of MOS transistors, which are disposed on an element isolation region adjacent to the second photoelectric conversion element,
wherein a voltage for bringing a MOS transistor out of conduction is supplied to a gate electrode of each of the plurality of MOS transistors during a whole accumulation period of each of the plurality of photoelectric conversion elements, and
wherein a width of the first channel stop region is greater than that of the second channel stop region.

* * * * *